(12) United States Patent
Matsunaga et al.

(10) Patent No.: US 7,388,784 B2
(45) Date of Patent: Jun. 17, 2008

(54) NONVOLATILE SEMICONDUCTOR MEMORY DEVICE INCLUDING MEMORY CELL UNITS EACH HAVING A GIVEN NUMBER OF MEMORY CELL TRANSISTORS

(75) Inventors: Yasuhiko Matsunaga, Yokohama (JP); Fumitaka Arai, Yokohama (JP); Kikuko Sugimae, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 39 days.

(21) Appl. No.: 11/452,986

(22) Filed: Jun. 15, 2006

(65) Prior Publication Data

US 2007/0002622 A1    Jan. 4, 2007

(30) Foreign Application Priority Data

Jun. 17, 2005 (JP) ............................ 2005-178188

(51) Int. Cl.
*G11C 16/04* (2006.01)
(52) U.S. Cl. ........................ 365/185.17; 365/185.01; 365/185.1
(58) Field of Classification Search ........... 365/185.17, 365/185.01, 185.1
See application file for complete search history.

(56) References Cited

U.S. PATENT DOCUMENTS 5,844,270 A * 12/1998 Kim et al. .................. 257/315
5,946,230 A * 8/1999 Shimizu et al. ........ 365/185.01
6,342,715 B1 * 1/2002 Shimizu et al. ............. 257/314
2005/0093047 A1 * 5/2005 Goda et al. ................. 257/300

FOREIGN PATENT DOCUMENTS

| JP | 4-79370 | 3/1992 |
|----|---------|--------|
| JP | 11-243195 | 7/1999 |
| JP | 2001-274366 | 10/2001 |

* cited by examiner

*Primary Examiner*—Thong Q. Le
(74) *Attorney, Agent, or Firm*—Oblon, Spivak, McClelland, Maier & Neustadt, P.C.

(57) ABSTRACT

A nonvolatile semiconductor memory device includes a plurality of memory cell units and a memory cell array in which the memory cell units are arranged in matrix. Each of the memory cell units has a given number of electrically writable and erasable memory cell transistors that are connected in a column direction to form a memory cell column. One end of the memory cell column is connected to a bit line via a first select gate transistor, and the other end thereof is connected to a source line via a second select gate transistor. At least part of a gate electrode of one of the first and second select gate transistors is provided in a trench formed in the surface area of a substrate along a direction parallel to a word line.

14 Claims, 26 Drawing Sheets

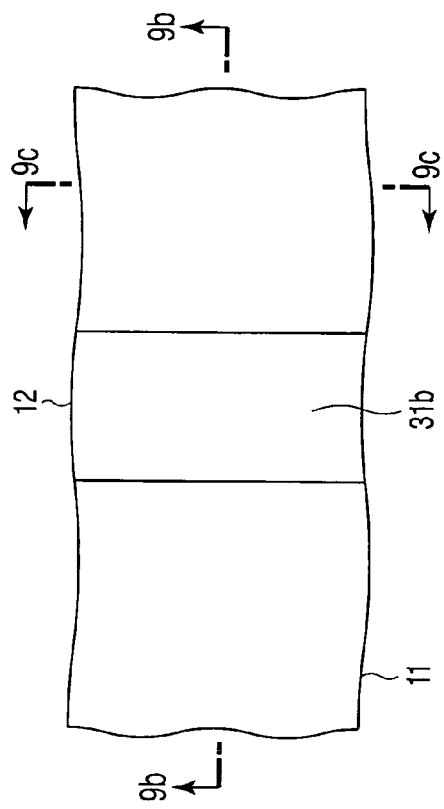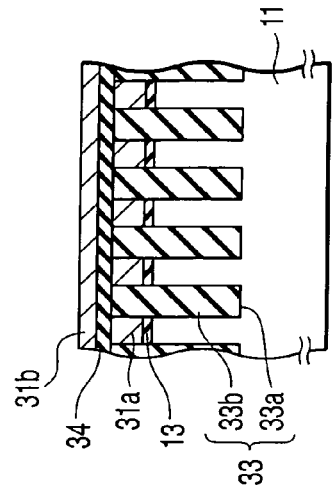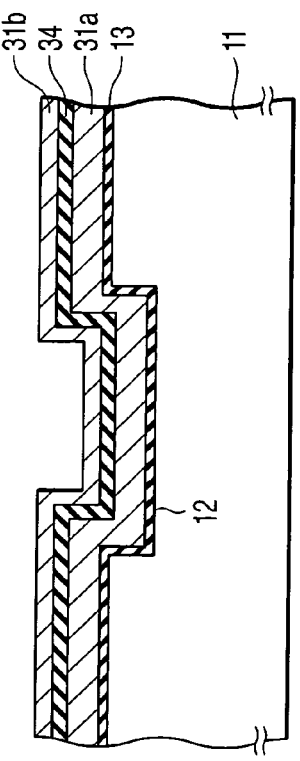

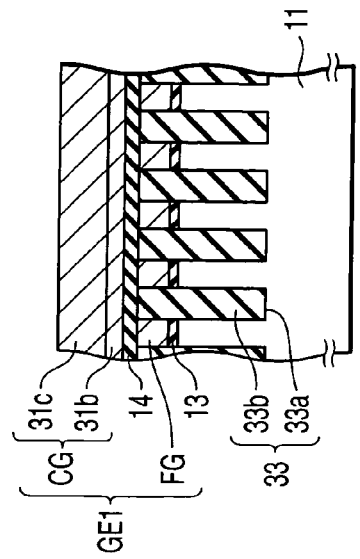
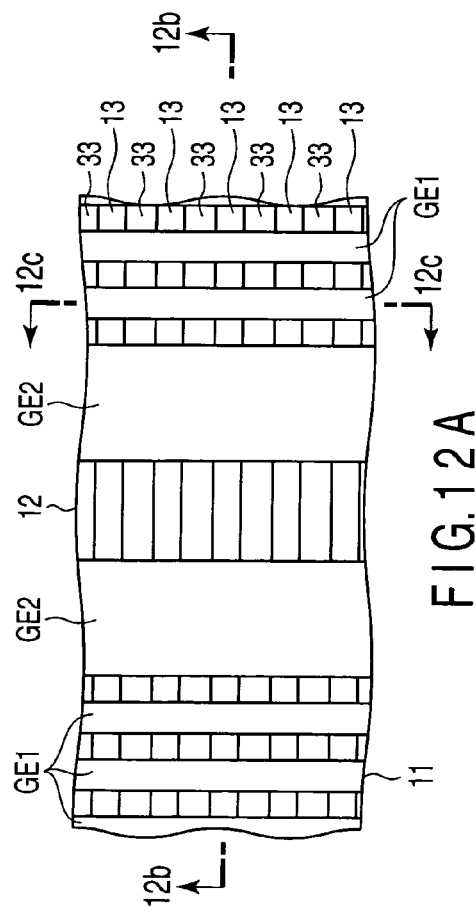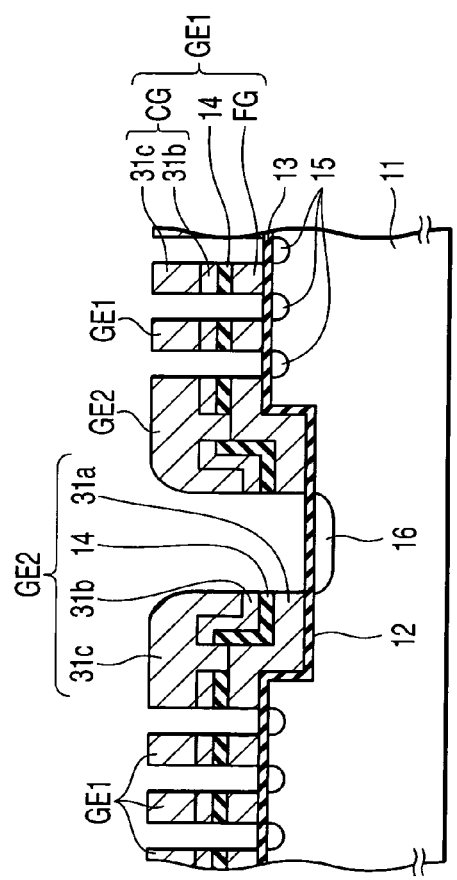

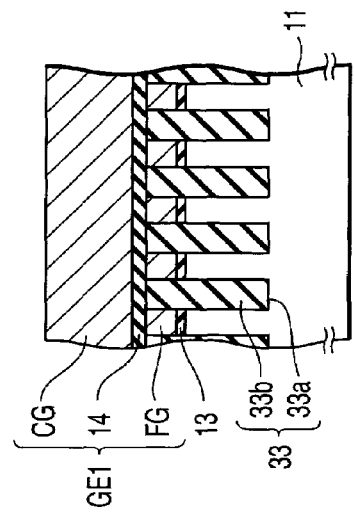
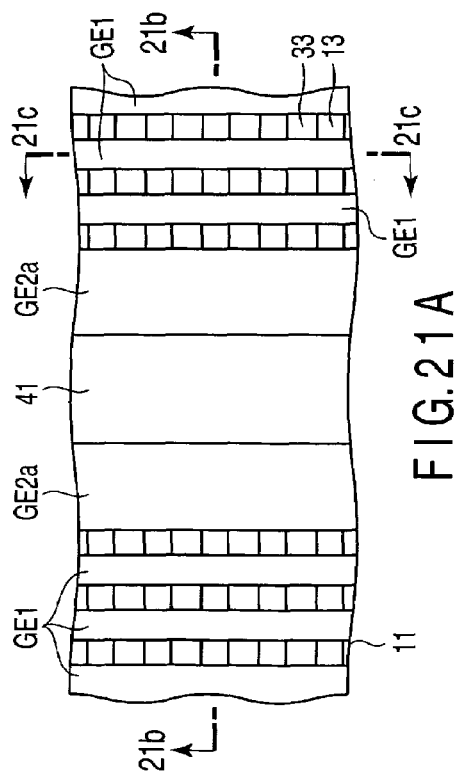
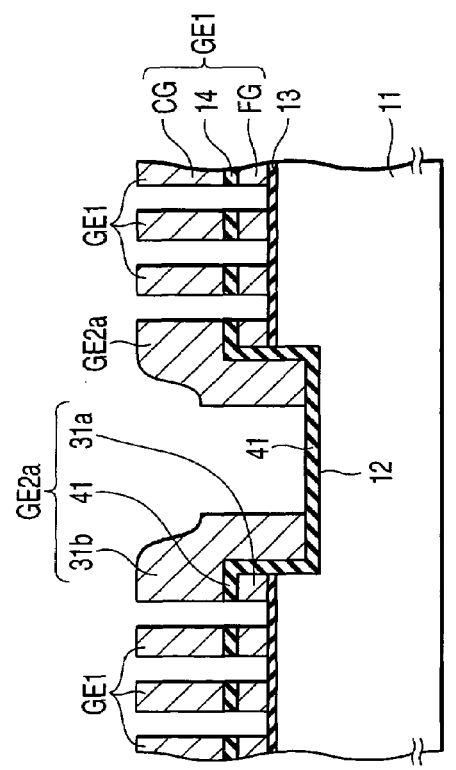

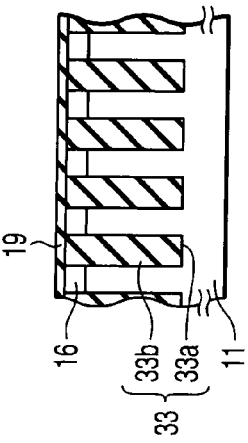
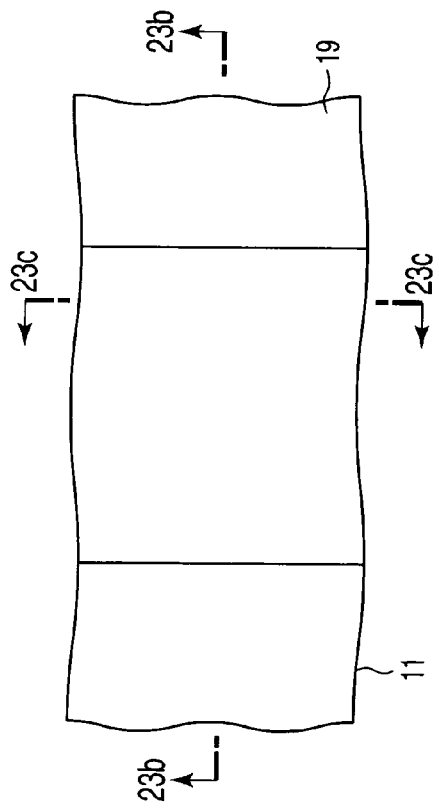
FIG. 23A
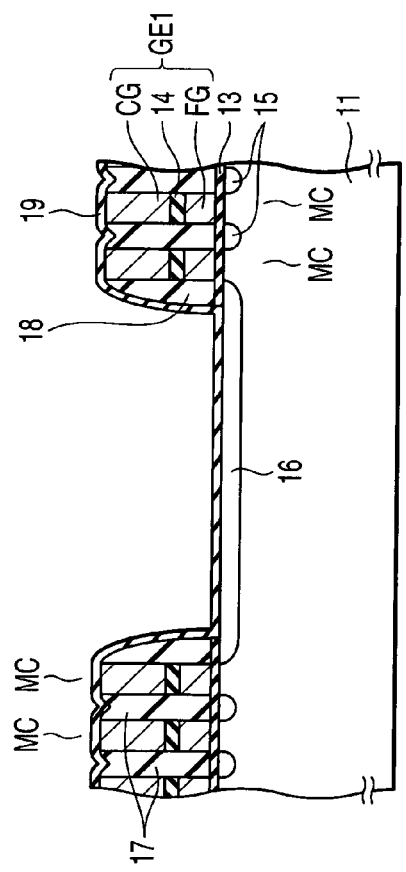
FIG. 23B
FIG. 23C

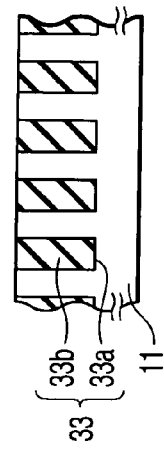
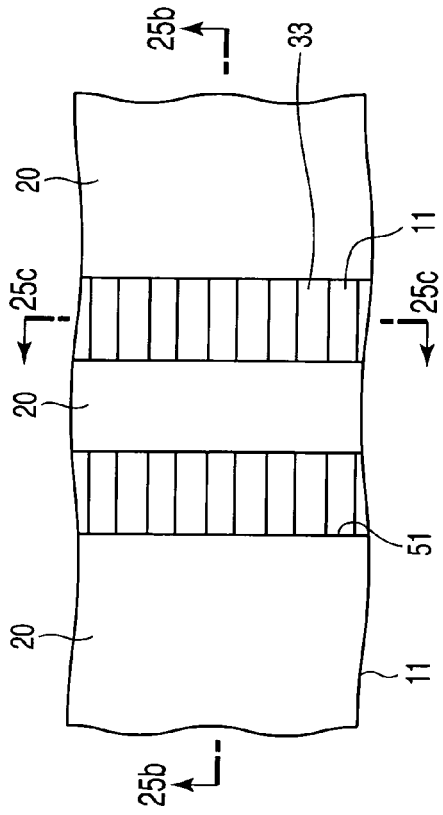
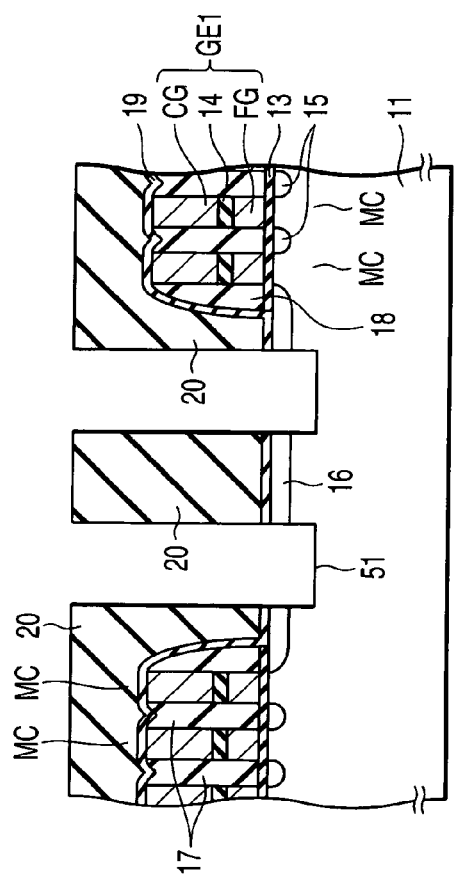

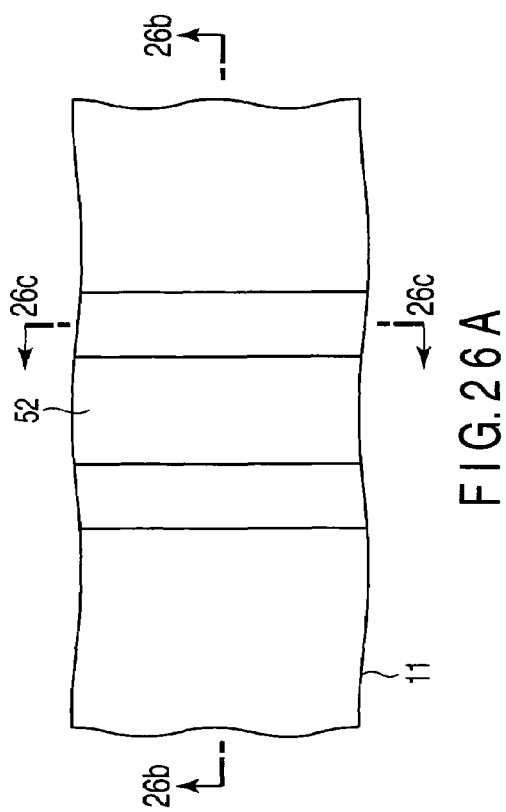
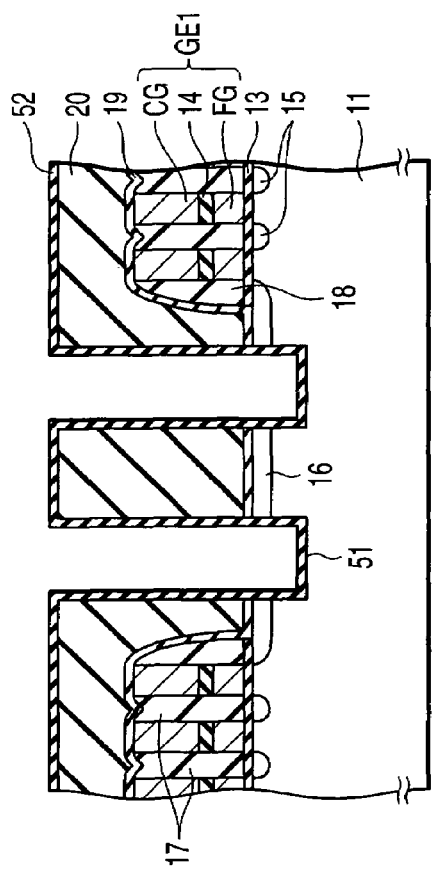
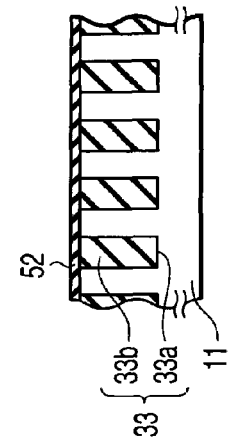

NONVOLATILE SEMICONDUCTOR MEMORY DEVICE INCLUDING MEMORY CELL UNITS EACH HAVING A GIVEN NUMBER OF MEMORY CELL TRANSISTORS

CROSS-REFERENCE TO RELATED APPLICATIONS

This application is based upon and claims the benefit of priority from prior Japanese Patent Application No. 2005-178188, filed Jun. 17, 2005, the entire contents of which are incorporated herein by reference.

BACKGROUND OF THE INVENTION

1. Field of the Invention

The present invention relates to a nonvolatile semiconductor memory device. More specifically, the invention relates to a nonvolatile semiconductor memory device including memory cell units each having a given number of memory cell transistors arranged in series in a column direction, such as a NAND flash memory (EEPROM: electrically erasable and programmable read only memory).

2. Description of the Related Art

As is known, a nonvolatile semiconductor memory device such as a NAND flash memory is useful in allowing data to be rewritten (written and erased) electrically though it is nonvolatile. Further, the memory device can increase in packing density and is decreasing in area (a transistor is decreasing in size) year by year.

Under the above circumstances, a nonvolatile semiconductor memory device has been proposed which is capable of greatly decreasing the size of a memory cell transistor whose gate electrode has a trench structure (refer to Jpn. Pat. Appln. KOKAI Publication No. 2001-274366, for example). In the proposed device, a memory cell transistor having a channel component in a vertical direction is formed to take measures against short-channel effects (SCE) due to the scaling of gate length.

However, the above prior art nonvolatile semiconductor memory device has the drawback that the scaling of gate length of a select gate transistor is more difficult than that of gate length of a memory cell transistor. The reason is as follows. A channel voltage that is cut off by a select gate transistor in write inhibit (or unwrite or unselect) mode does not drop due to the scaling. In other words, a boosted channel voltage cannot be cut off sufficiently if the gate length of a select gate transistor is decreased by scaling. The nonscaling of the select gate transistor is becoming a limiting factor in reducing the device in area.

In the future, the gate length of a select gate transistor needs to be decreased by scaling to meet a demand that a device should be reduced in area. A search for the best way to do so is being carried out.

BRIEF SUMMARY OF THE INVENTION

According to a first aspect of the present invention, there is provided a nonvolatile semiconductor memory device comprising: a plurality of memory cell units, each of the memory cell units having a given number of electrically writable and erasable memory cell transistors which are connected in a column direction to form a memory cell column, one end of the memory cell column being connected to a bit line via a first select gate transistor, other end thereof being connected to a source line via a second select gate transistor, and at least part of a gate electrode of one of the first and second select gate transistors being provided in a trench formed in a surface area of a substrate along a direction parallel to a word line; and a memory cell array in which the memory cell units are arranged in matrix.

BRIEF DESCRIPTION OF THE SEVERAL VIEWS OF THE DRAWING

FIGS. 9A to 9C are illustrations of a method for manufacturing a nonvolatile semiconductor memory device, taking the cell array shown in FIG. 3 as an example;

FIGS. 12A to 12C are illustrations of a method for manufacturing a nonvolatile semiconductor memory device, taking the cell array shown in FIG. 3 as an example;

FIGS. 21A to 21C are illustrations of a method for manufacturing a nonvolatile semiconductor memory device, taking the cell array shown in FIG. 15 as an example;

FIGS. 23A to 23C are illustrations of a method for manufacturing a nonvolatile semiconductor memory device, taking the cell array shown in FIG. 22 as an example;

FIGS. 25A to 25C are illustrations of a method for manufacturing a nonvolatile semiconductor memory device, taking the cell array shown in FIG. 22 as an example;

FIGS. 26A to 26C are illustrations of a method for manufacturing a nonvolatile semiconductor memory device, taking the cell array shown in FIG. 22 as an example;

DETAILED DESCRIPTION OF THE INVENTION

Embodiments of the present invention will be described below with reference to the accompanying drawings. It should be noted that the drawings are schematic ones and the dimension ratios shown therein are different from the actual ones. Needless to say, the dimensions vary from drawing to drawing and so do the ratios of dimensions.

FIRST EMBODIMENT

Figure 1:
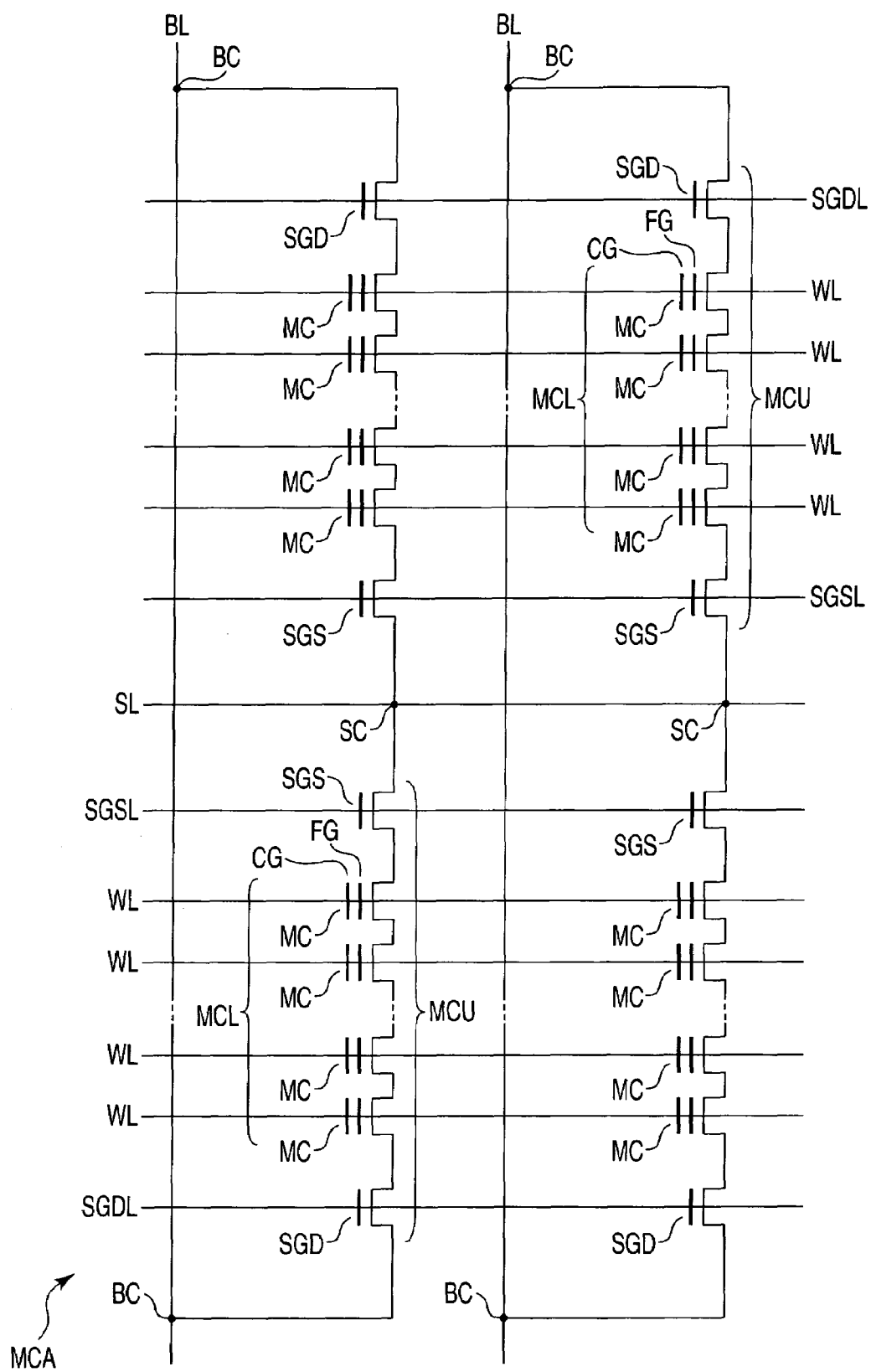
FIG. 1 is a circuit diagram showing a basic arrangement of a nonvolatile semiconductor memory device (an equivalent circuit of a cell array in a NAND flash memory) according to a first embodiment of the present invention.

FIG. 1 shows a basic arrangement of a nonvolatile semiconductor memory device (an equivalent circuit of a cell array) according to a first embodiment of the present invention. The nonvolatile semiconductor memory device will be described, taking a NAND flash memory (EEPROM) as an example, which includes NAND type memory cell units each having a given number of memory cell transistors arranged in series in a column direction.

Referring to FIG. 1, a memory cell array MCA of the nonvolatile semiconductor memory device comprises a plurality of memory cell units (NAND columns) MCU arranged in matrix. One end of each of the memory cell units MCU is connected to a bit line BL and the other end thereof is connected to a common source line SL.

Each of the memory cell units MCU includes first and second select gate transistors SGD and SGS and a memory cell column MCL. The memory cell column MCL is made up of a given number of memory cell transistors (e.g., sixteen unit cells) MC arranged in series in a column direction. One end of the memory cell column MCL is connected to the bit line BL via the first select gate transistor SGD, and the other end thereof is connected to the common source line SL via the second select gate SGS.

Each of the memory cell transistors MC includes a gate electrode section having a double gate structure (stacked structure) in which a floating gate FG is provided between a control gate CG and a silicon (Si) substrate. Data is electrically rewritten (written or erased) according to whether the floating gate FG contains electric charges. The control gates CG of memory cell transistors MC in a row direction are connected to a common word line WL.

The first select gate transistor SGD is a metal oxide semiconductor (MOS) transistor and its drain is connected to the bit line BL. The second select gate transistor SGS is also a MOS transistor and its source is connected to the common source line SL. The gate electrode sections of first select gate transistors SGD in the row direction are connected to a common select gate line SGDL, while those of second select gate transistors SGS in the row direction are connected to a common select gate line SGSL.

Figure 2:
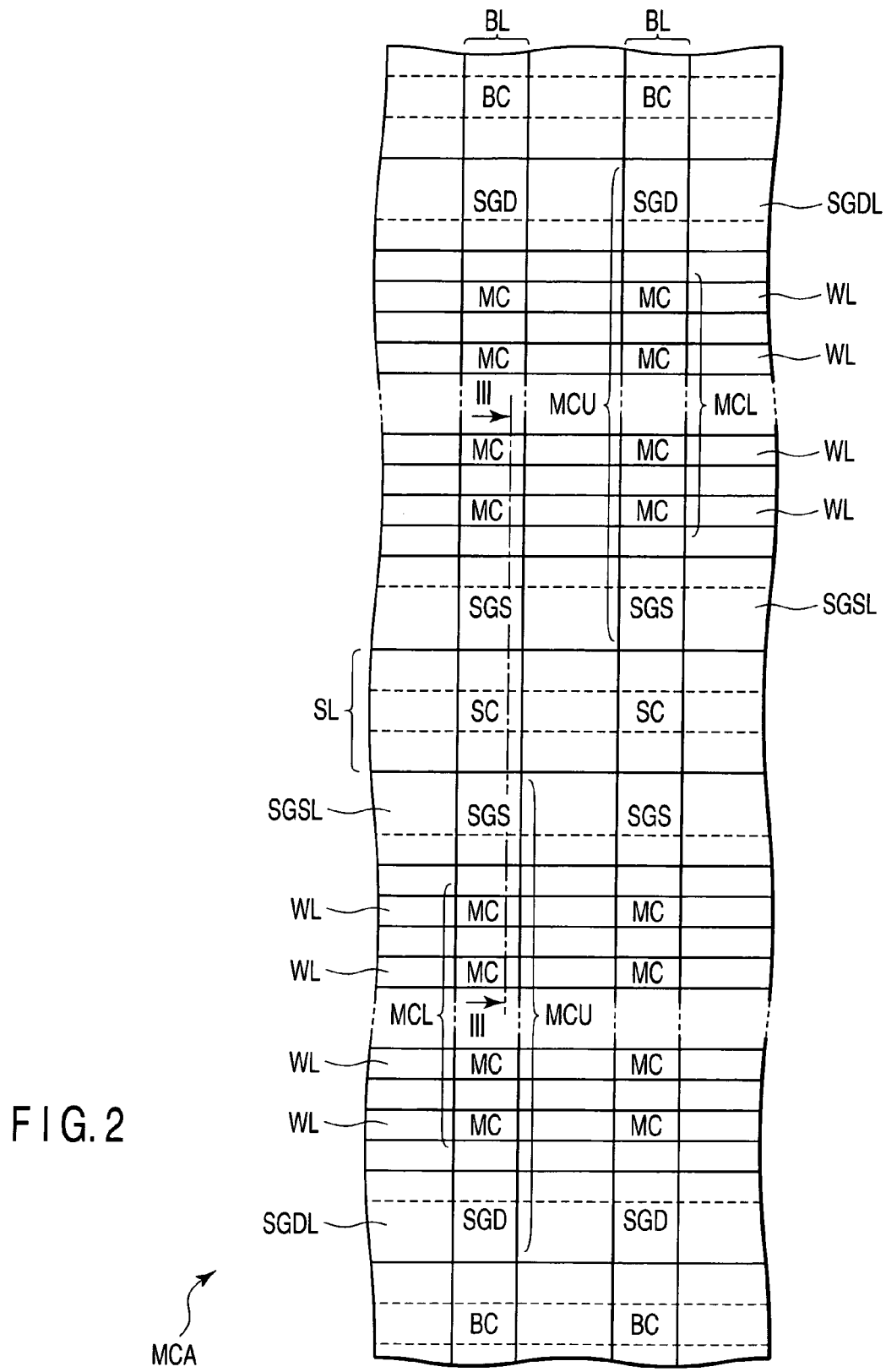
FIG. 2 is a plan view of a layout of the cell array shown in FIG. 1.

FIG. 2 depicts a layout of the memory cell array MCA shown in FIG. 1. In FIG. 2, the memory cell array MCA is shown partly three-dimensionally. In adjacent memory cell units MCU, the drains of first select gate transistors SGD are connected to the bit lines BL via bit line contacts BC, and the sources of second select gate transistors SGS are connected to the common source lines SL via source line contacts SC.

Figure 3:
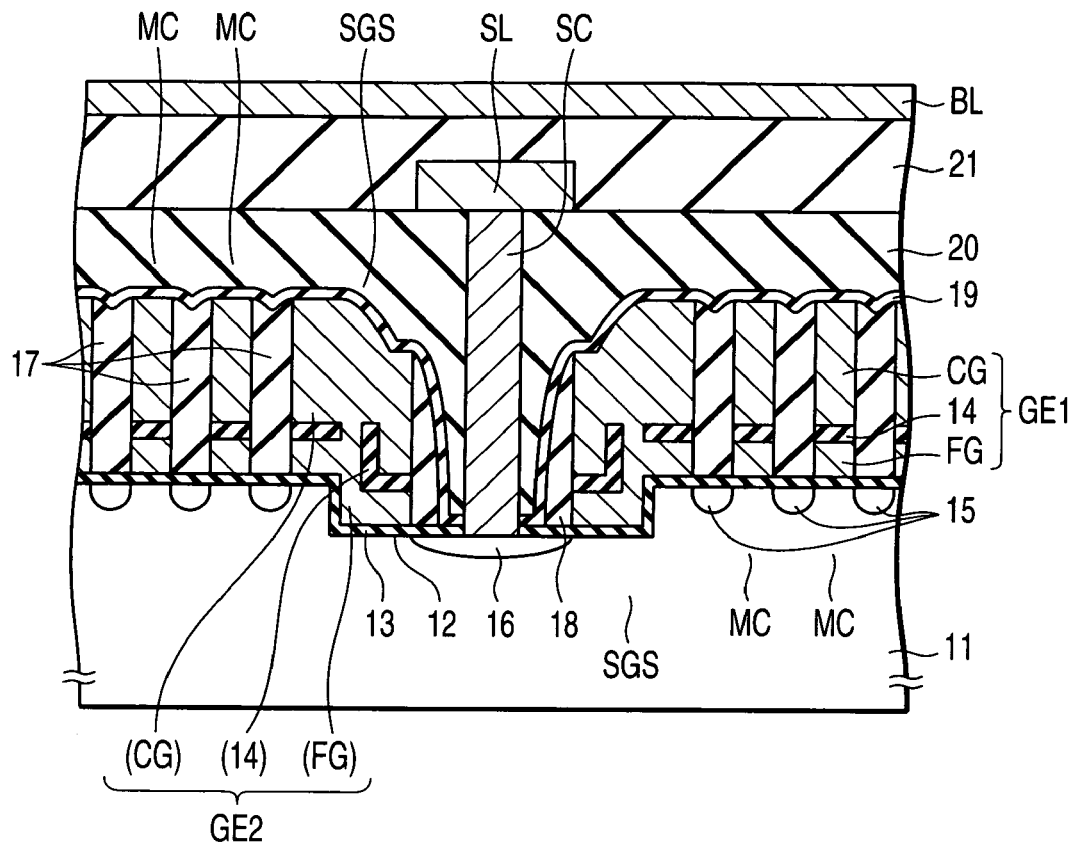
FIG. 3 is a sectional view of the principal part of the cell array shown in FIG. 1.

FIG. 3 is a schematic sectional view taken along line III-III of FIG. 2, showing a section of the memory cell array MCA described above. As shown in FIG. 3, a trench 12 is selectively formed to a given depth in the surface area of a silicon substrate 11. The trench 12 is provided in the row direction that is parallel to the word line WL. The opposed sidewalls of the trench 12 are almost perpendicular (90 degrees) to the top surface (horizontal surface) of the silicon substrate 11.

The memory cell transistors MC of each of the memory cell units MCU are formed in the surface area of the silicon substrate 11, except in the trench 12. Each of the memory cell transistors MC includes a gate insulation film (e.g., a thin tunnel oxide film) 13, a floating gate FG, an interpolysilicon insulation film 14 and a control gate CG. The floating gate FG, insulation film 14 and control gate CG serve as a gate electrode section GE1. The control gates CG of the memory cell transistors MC are connected to each other to continue in the row direction as a word line WL. A diffusion layer 15, which serves as a source or a drain of each memory cell transistor MC, is formed in the surface area of the silicon substrate 11 in conformity with both sides of the gate electrode section GE1.

The trench 12 includes opposed gate electrode sections GE2 of second select gate transistors SGS in adjacent memory cell units MCU in the column direction. The gate electrode sections GE1 and GE2 have almost the same structure and are formed at once in almost the same step. More specifically, the gate electrode section GE2 has a conductive film for forming the floating gate FG on the gate insulation film 13, an insulation film (e.g., an ONO film or a high-k film) for forming the interpolysilicon insulation film 14 and a conductive film for forming the control gate CG. Basically, the gate electrode section GE2 has a single-layer gate structure in which the insulation film serving as the interpolysilicon insulation film 14 is partly removed to electrically connect the conductive films, which serve as the floating gate FG and the control gate CG, with each other in order to avoid a stacked gate structure.

A diffusion layer 16 serving as a source common to the second select gate transistors SGS is provided between the opposed gate electrode sections GE2 in the trench 12 of the silicon substrate 11. The drain of each of the second select gate transistors SGS and the diffusion layer 15 of the memory cell transistor MC adjacent thereto are common to each other.

In the first embodiment, at least part of the gate electrode section GE2 of each of the select gate transistors SGS is formed on either sidewall of the trench 12. In other words, at least part of the gate electrode section GE2 is buried into the trench 12. The gate electrode section GE2 can thus be increased in length (gate length) in the vertical direction of the silicon substrate 11. Even though the gate electrode section GE2 is decreased in gate length in the horizontal direction by scaling, the select gate transistor SGS can have a channel component in the vertical direction to take measures against short-channel effects (SCE). Consequently, as the device (NAND flash memory) decreases in area, the select gate transistors SGS can adequately be decreased in gate length in the horizontal direction by scaling, which was conventionally impossible.

Particularly in the NAND flash memory, no high voltage is applied to the gate electrode sections GE2 of the second select gate transistors SGS. Even though the transistors SGS are decreased in gate length by scaling, the problems with the concentration of electric fields and the reliability of the gate insulation film 13 can be avoided.

As described above, the gate electrode sections GE1 and GE2 have almost the same structure and are formed at once in almost the same step. The first embodiment does not require any special, complicated step, but can easily be achieved only by adding a step of forming the trench 12, a step of removing part of the interpolysilicon insulation film 14, and the like.

A first interlayer insulation film 17 is buried between gate electrode sections GE1 of the memory cell transistors MC. A sidewall insulation film 18, which is made of the same material as that of the first interlayer insulation film 17, is formed on each of the sidewalls of the opposed gate electrode sections GE2 of the select gate transistors SGS. A second interlayer insulation film 20 is deposited on the top surfaces of the gate electrode sections GE1, the first interlayer insulation films 17 and the gate electrode sections GE2, with a barrier insulation film (e.g., a SiN film) 19 interposed therebetween. The film 20 is also deposited between the gate electrode sections GE2.

A source line contact SC is provided between the gate electrode sections GE2 of the second select gate transistors SGS. One end of the source line contact SC is connected to the diffusion layer 16 through the second interlayer insulation film 20, barrier insulation film 19 and gate insulation film 13. The other end thereof is connected to the common source line SL provided on the top surface of the second interlayer insulation film 20 in the row direction. The bit lines BL are provided on the common source line SL with a third interlayer insulation film 21 interposed therebetween, so as to extend in the direction (column direction) perpendicular to the common source line SL.

Though not shown, the first select gate transistors SGD connected to the bit lines BL via the bit line contacts BC have almost the same structure as that of the second select gate transistors SGS.

As described above, the trench 12 is formed in the surface area of the silicon substrate 11, and at least part of the gate electrode section GE2 of each of the select gate transistors SGD and SGS is formed in the trench 12. The select gate transistors SGD and SGS can thus be increased in gate length by the depth of the trench 12 and have channel components in the vertical direction to take measures against short-channel effects (SCE). Consequently, the select gate transistors SGD and SGS can be decreased in gate length in the horizontal direction by scaling without degrading cutoff characteristics, with the result that the NAND flash memory can be more decreased in area.

A method of manufacturing the above-described NAND flash memory (EEPROM) will be described with reference to FIGS. 4A to 4C through FIGS. 12A to 12C. In order to describe the method, the second select gate transistors SGS shown in FIG. 3 are taken as an example. Of these figures, FIGS. 4A, 5A, 6A, 7A, 8A, 9A, 10A, 11A and 12A are plan views, FIGS. 4B, 5B, 6B, 7B, 8B, 9B, 10B, 11B and 12B are sectional views taken along the bit lines (the direction of gate length L of cells), and FIGS. 4C, SC, 6C, 7C, 8C, 9C, 10C, 11C and 12C are sectional views taken along the word lines (the direction of gate width W of cells).

Figure 4C:
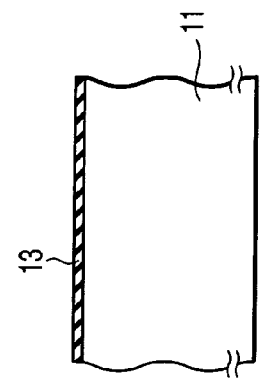
FIGS. 4A to 4C are illustrations of a method for manufacturing a nonvolatile semiconductor memory device, taking the cell array shown in FIG. 3 as an example.
Figure 4A:
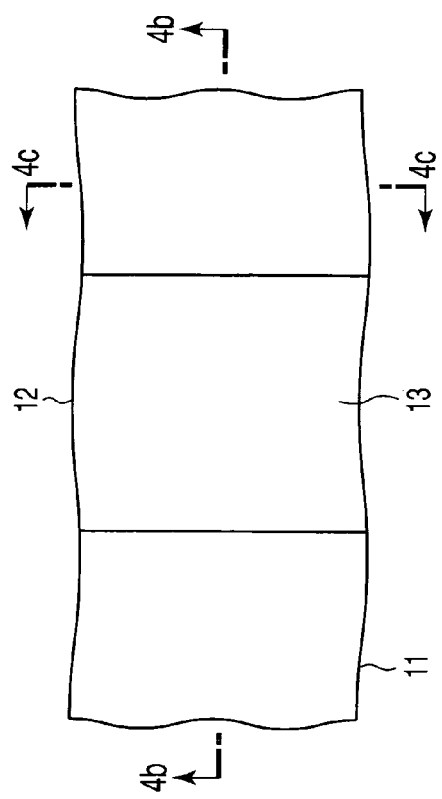
Figure 4B:
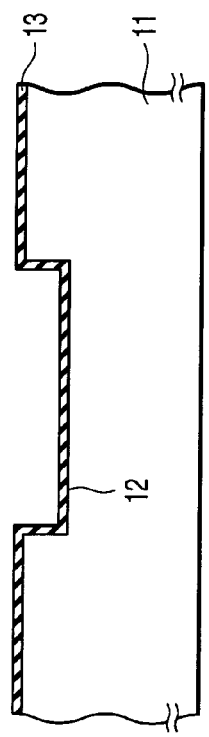

Referring first to FIGS. 4A to 4C, a trench 12 is formed to a given depth in the surface area of a silicon substrate 11 in conformity with a select gate transistor SGS forming section. Then, a gate insulation film 13 is formed on the entire top surface of the silicon substrate 11.

Figure 5C:
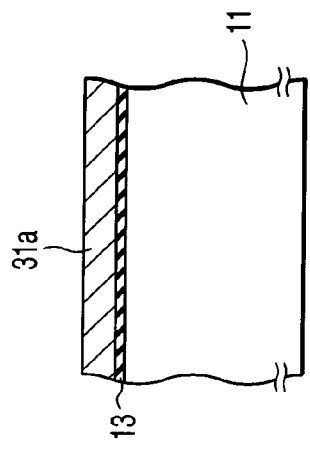
FIGS. 5A to 5C are illustrations of a method for manufacturing a nonvolatile semiconductor memory device, taking the cell array shown in FIG. 3 as an example.
Figure 5A:
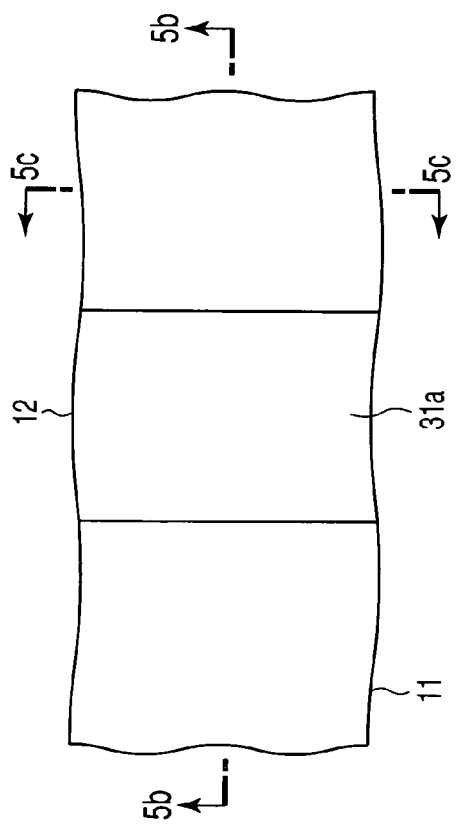
Figure 5B:
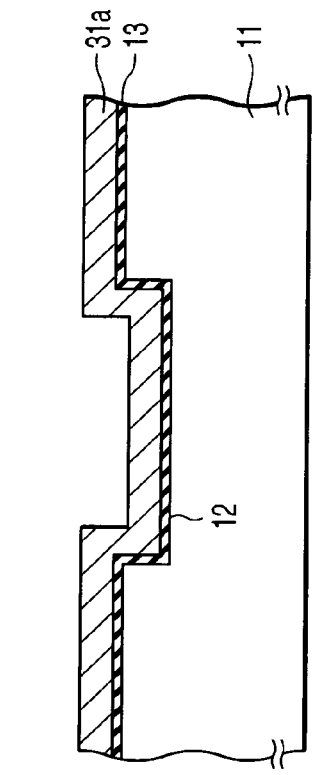

Referring then to FIGS. 5A to 5C, a conductive film 31a serving as a floating gate FG is deposited on the entire top surface of the gate insulation film 13. The conductive film 31a is etched back to have an almost uniform thickness along the trench 12.

Figure 6C:
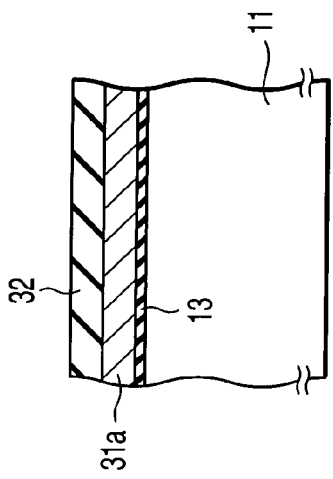
FIGS. 6A to 6C are illustrations of a method for manufacturing a nonvolatile semiconductor memory device, taking the cell array shown in FIG. 3 as an example.
Figure 6A:
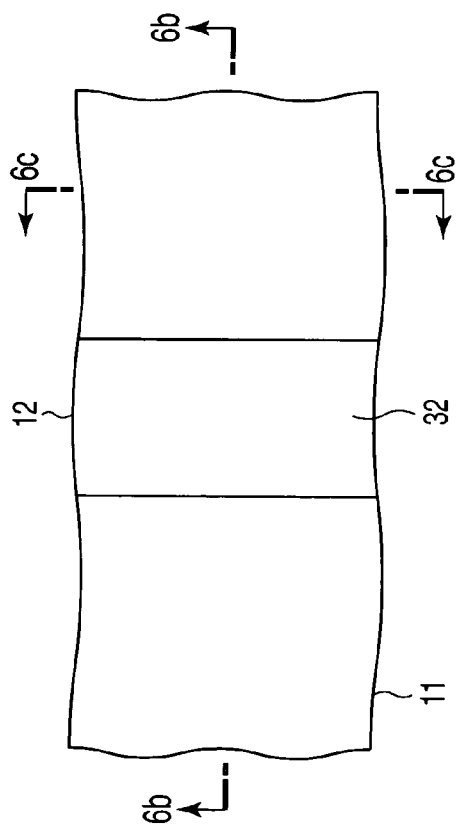
Figure 6B:
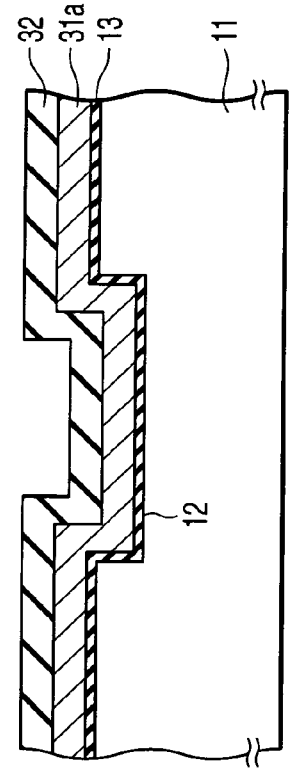

Referring to FIGS. 6A to 6C, a silicon nitride film (SiN film) 32 serving as a mask member is deposited on the entire top surface of the conductive film 31a to have an almost uniform thickness.

Figure 7C:
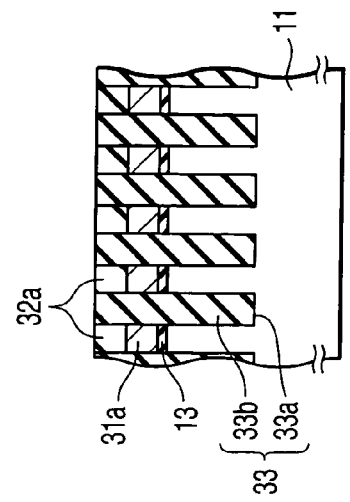
FIGS. 7A to 7C are illustrations of a method for manufacturing a nonvolatile semiconductor memory device, taking the cell array shown in FIG. 3 as an example.
Figure 7A:
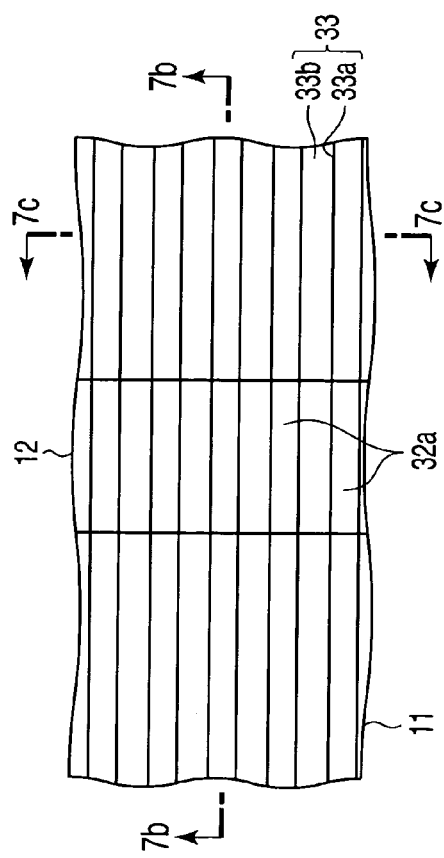
Figure 7B:
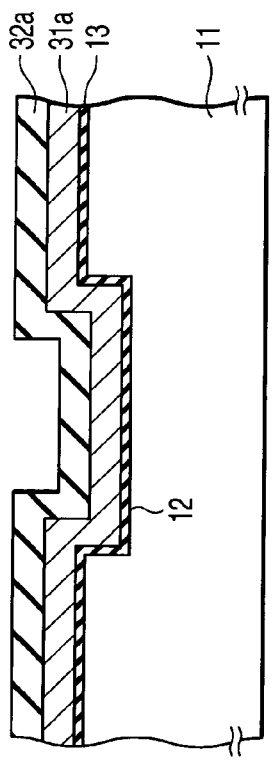

As shown in FIGS. 7A to 7C, the SiN film 32 is processed to form mask patterns 32a used for forming element isolation regions 33 having a shallow trench isolation (STI) structure. The mask patterns 32a are arranged in a striped fashion in the column direction along the bit lines. Using the mask patterns 32a, their underlying conductive film 31a, gate insulation film 13 and silicon substrate 11 are etched to form a plurality of trenches 33a. After that, the trenches 33a are filled with their respective element isolating insulation films (e.g., oxide films) 33b and then the top surfaces of the films 33b are flattened by chemical mechanical polishing (CMP) or the like using the mask patterns 32a as stoppers, thereby completing the element isolation regions 33.

Figure 8C:
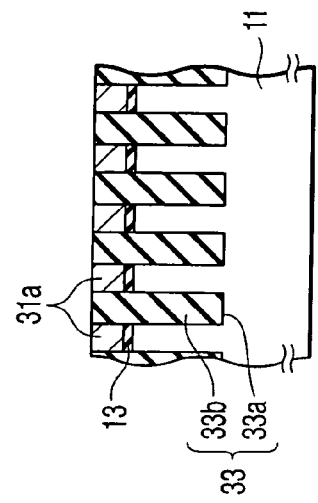
FIGS. 8A to 8C are illustrations of a method for manufacturing a nonvolatile semiconductor memory device, taking the cell array shown in FIG. 3 as an example.
Figure 8A:
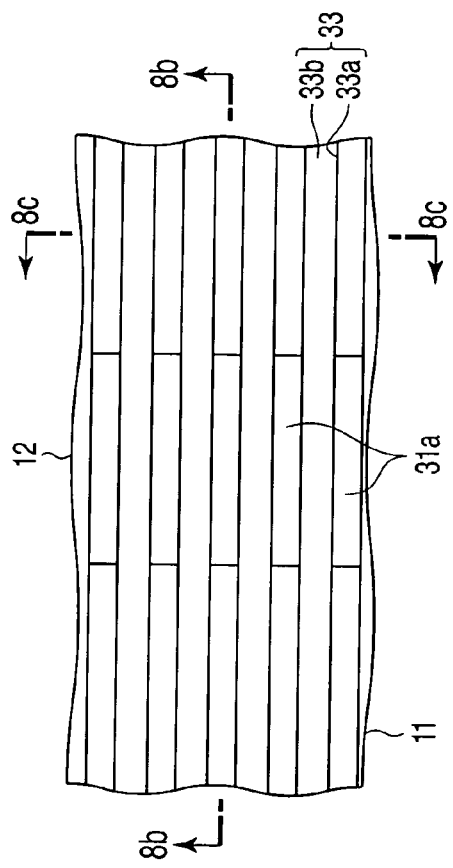
Figure 8B:
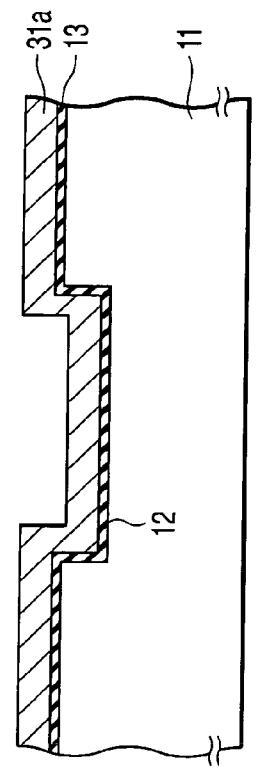

Referring then to FIGS. 8A to 8C, the mask patterns 32a are separated and then the top surfaces of the element isolation regions 33 are etched back to make the regions 33 flush with the top surface of the conductive film 31a.

Referring then to FIGS. 9A to 9C, an insulation film 34 serving as the interpolysilicon insulation film 14 and a first-layered conductive film 31b serving as the control gate CG are deposited in sequence on the entire top surfaces of the conductive films 31a and element isolation regions 33.

Figure 10C:
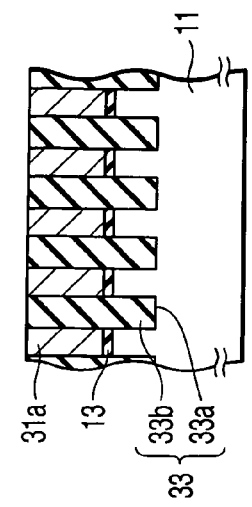
FIGS. 10A to 10C are illustrations of a method for manufacturing a nonvolatile semiconductor memory device, taking the cell array shown in FIG. 3 as an example.
Figure 10A:
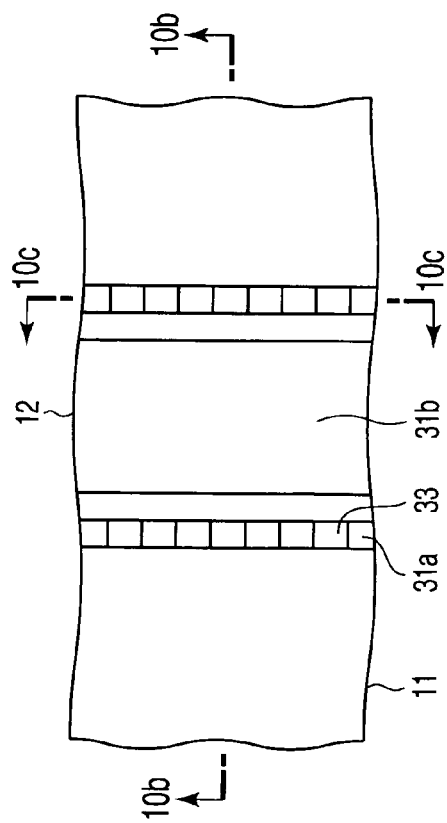
Figure 10B:
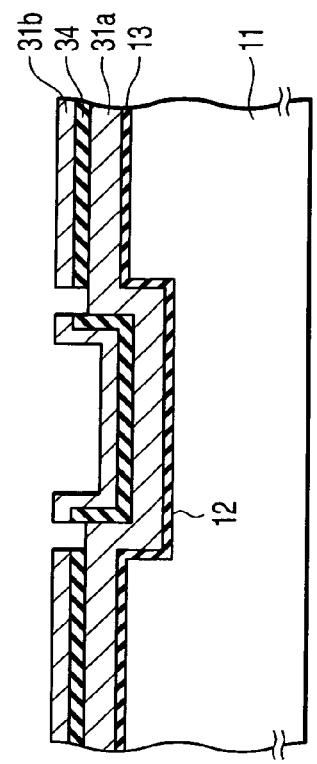

Referring then to FIGS. 10A to 10C, part of each of the films 31b and 34 that conforms to the trench 12 is opened by photolithography to expose the top surfaces of the conductive films 31a that underlie the film 34.

Figure 11C:
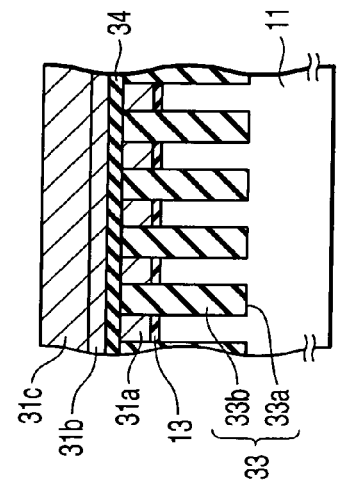
FIGS. 11A to 11C are illustrations of a method for manufacturing a nonvolatile semiconductor memory device, taking the cell array shown in FIG. 3 as an example.
Figure 11A:
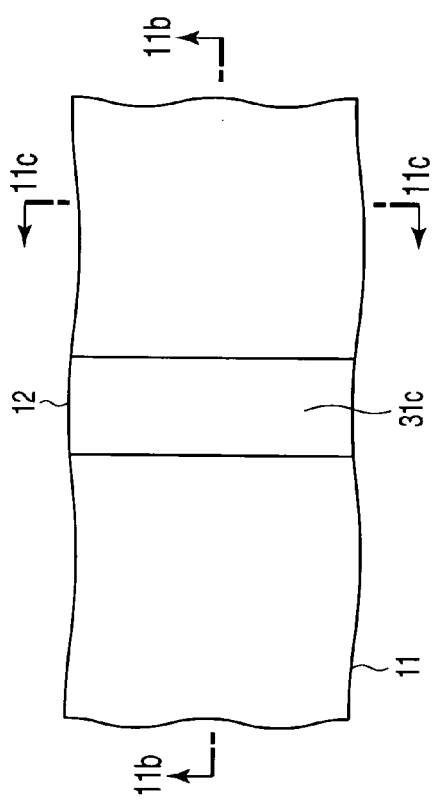
Figure 11B:
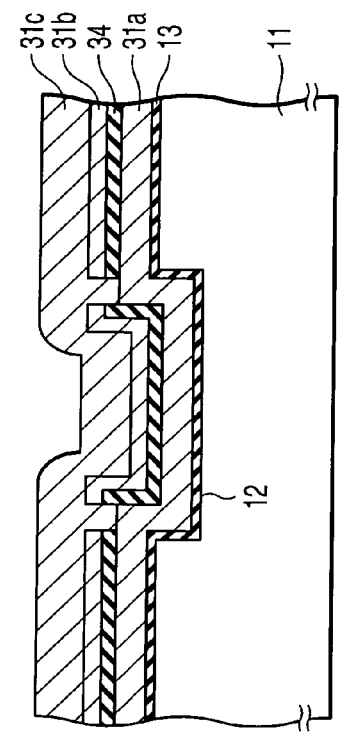

Referring then to FIGS. 11A to 11C, a second-layered conductive film 31c serving as the control gate CG is deposited on the entire top surface of the first-layered conductive film 31b. Part of the conductive film 31c is electrically connected to its underlying conductive film 31a through the above opening.

Referring then to FIGS. 12A to 12C, the conductive layers 31c, 31b and 31a and the insulation film 34 are processed to form gate electrode sections GE1 of memory cell transistors MC on the surface of the silicon substrate 11 and, at the same time, gate electrode sections GE2 of select gate transistors SGS on at least the opposed sidewalls of the trench 12. In the first embodiment, the gate electrode sections GE2 have channel components in the vertical direction and their gate length can sufficiently be decreased in the horizontal direction.

Subsequently, diffusion layers 15 each serving as a source or drain of the memory cell transistor MC are formed by ion implantation or the like in the surface area of the silicon substrate 11, with the gate insulation film 13 interposed therebetween, in conformity with both sides of each of the gate electrode sections GE1. At the same time, a diffusion layer 16 serving as a source of the select gate transistors SGS is formed in the silicon substrate 11 and between the gate electrode sections GE2 in conformity with the trench 12. The drain of the select gate transistor SGS and the diffusion layer 15 of the memory cell transistor MC adjacent thereto are common to each other. Thus, the memory cell transistors MC of each memory cell unit MCU are completed, as are the select gate transistors SGS having channel components in the vertical direction.

After that, a first interlayer insulation film 17 is deposited on the entire surface of the resultant structure and buried into a gap between the gate electrode sections GE1 of the memory cell transistors MC. Then, the first interlayer insulation film 17 is etched back or the like to form a sidewall insulation film 18 on each of the sidewalls of the opposed gate electrode sections GE2 of the select gate transistors SGS.

A barrier insulation film 19 and a second interlayer insulation film 20 are deposited on the entire surface of the resultant structure and then the top surface of the film 20 is flattened. A source line contact SC, which is connected to the diffusion layer 16, is formed between the gate electrode sections GE2 of the select gate transistors SGS through the second interlayer insulation film 20, barrier insulation film 19 and gate insulation film 13. After a common source line SL, which is connected to the source line contact SC, is formed on the top surface of the second interlayer insulation film 20, a third interlayer insulation film 21 is formed on the entire surface of the resultant structure. Then, a bit line BL, which is connected to a select gate transistor SGD (not shown), is formed on the top surface of the third interlayer insulation film 21. Thus, a memory cell array MCA having a section as shown in FIG. 3 is completed.

As described above, the select gate transistors SGD are formed in almost the same step and at almost the same time as the select gate transistors SGS. The former transistors SGD differ from the latter transistors SGS in the following. The third interlayer insulation film 21 is formed without forming any source line contact SC after the top surface of the second interlayer insulation film 20 is flattened. The bit line contact BC, which is connected to the diffusion layer 16, is formed through the third interlayer insulation film 21, second interlayer insulation film 20, barrier insulation film 19 and gate insulation film 13. After that, a bit line BL that is connected to the bit line contact BC is formed on the top surface of the third interlayer insulation film 21.

Figure 13:
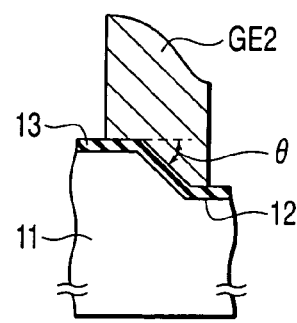
FIG. 13 is a sectional view of an example of angle θ between the top surface of a silicon substrate and a groove thereof in the cell array shown in FIG. 3.
Figure 14:
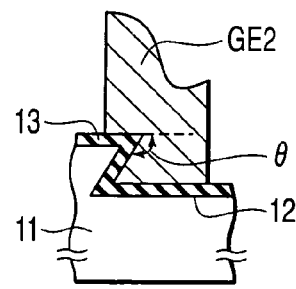
FIG. 14 is a sectional view of another example of angle θ between the top surface of the silicon substrate and the groove thereof in the cell array shown in FIG. 3.

In the foregoing first embodiment, the opposed sidewalls of the trench 12 are each almost perpendicular to the top surface of the silicon substrate 11. The present invention is not limited to this. The same advantages can be obtained if angle θ between each of the sidewalls and the top surface of the silicon substrate 11 is 20 degrees or more as shown in FIG. 13 or it is 160 degrees or less as shown in FIG. 14.

SECOND EMBODIMENT

Figure 15:
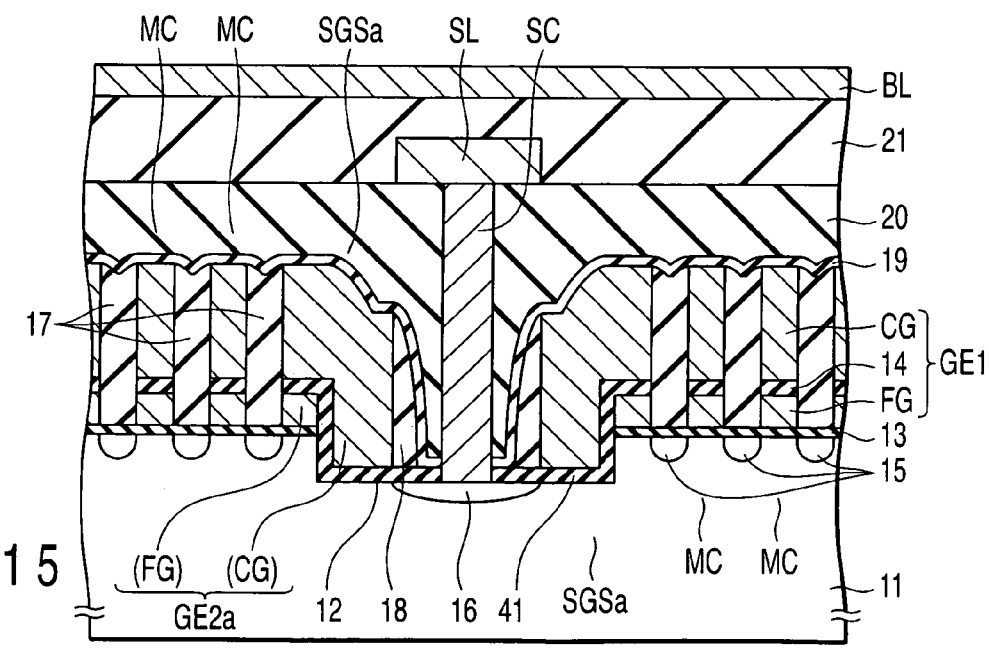
FIG. 15 is a sectional view showing a basic arrangement of the principal part of a nonvolatile semiconductor memory device (a sectional view of a cell array in a NAND flash memory) according to a second embodiment of the present invention.

FIG. 15 shows a basic arrangement of a nonvolatile semiconductor memory device (a section of a cell array) according to a second embodiment of the present invention. The nonvolatile semiconductor memory device will be described, taking a NAND flash memory (EEPROM) as an example, which includes NAND type memory cell units each having a given number of memory cell transistors arranged in series in a column direction. FIG. 15 is a sectional view taken along line III-III of FIG. 2. The same elements as those of FIG. 3 are denoted by the same reference numerals and their detailed descriptions are omitted.

Referring to FIG. 15, a trench 12 is selectively formed to a given depth in the surface area of a silicon substrate 11. The trench 12 is provided in the row direction that is parallel to a word line WL. The opposed sidewalls of the trench 12 are almost perpendicular (90 degrees) to the top surface (horizontal surface) of the silicon substrate 11.

The memory cell transistors MC of each of the memory cell units MCU are formed in the surface area of the silicon substrate 11, except in the trench 12. Each of the memory cell transistors MC includes a gate insulation film (e.g., a thin tunnel oxide film) 13, a floating gate FG, an interpolysilicon insulation film (an ONO film or a high-k film such as $Al_2O_3$ and HfOx) 14 and a control gate CG. The floating gate FG, insulation film 14 and control gate CG serve as a gate electrode section GE1. The control gates CG of the memory cell transistors MC are connected to each other to continue in the row direction as a word line WL. A diffusion layer 15, which serves as a source or a drain of each of the memory cell transistors MC, is formed in the surface area of the silicon substrate 11 in conformity with both sides of the gate electrode section GE1.

The trench 12 includes opposed gate electrode sections GE2a of select gate transistors SGSa in adjacent memory cell units MCU in the column direction. Basically, the gate electrode sections GE2a have a single-layered gate structure. A gate insulation film 41 (e.g., an insulation film for forming the interpolysilicon insulation film 14), which is formed immediately under the gate electrode sections GE2a, differs in type or thickness from the gate insulation film 13 that is formed immediately under the gate electrode sections GE1 of the memory cell transistors MC. More specifically, the gate electrode sections GE2a are formed chiefly of conductive films for forming control gates CG that are provided on the gate insulation film 41. However, each of the gate electrode sections GE2a includes a conductive film for forming a floating gate FG in terms of a manufacturing process. If the number of hot carriers injected into the conductive film (FG) is very small, the conductive film causes no problems practically.

A diffusion layer 16 serving as a source common to the select gate transistors SGSa is provided between the opposed gate electrode sections GE2a in the trench 12 of the silicon substrate 11. The drain of each of the select gate transistors SGSa and the diffusion layer 15 of the memory cell transistor MC adjacent thereto are common to each other.

In the second embodiment, at least part of the gate electrode section GE2a of each of the select gate transistors SGSa is formed on either sidewall of the trench 12. In other words, at least part of the gate electrode section GE2a is buried into the trench 12. The gate electrode section GE2a can thus be increased in length (gate length) in the vertical direction of the silicon substrate 11. Even though the gate electrode section GE2a is decreased in gate length by scaling, the select gate transistor SGSa can have a channel component in the vertical direction to take measures against short-channel effects (SCE). Consequently, as the device (NAND flash memory) decreases in area, the select gate transistors SGSa can adequately be decreased in gate length in the horizontal direction by scaling, which was conventionally impossible.

In the second embodiment, the gate insulation film 41, which is formed immediately below the gate electrode sections GE2a, can easily be caused to differ in type and thickness from the gate insulation film 13 that is formed immediately below the gate electrode sections GE1. Even though the select gate transistors SGSa are decreased in gate length by scaling, the problems with the concentration of electric fields and the reliability of the gate insulation film 14 can be avoided.

A first interlayer insulation film 17 is buried between gate electrode sections GE1 of the memory cell transistors MC. A sidewall insulation film 18, which is made of the same material as that of the first interlayer insulation film 17, is formed on each of the sidewalls of the opposed gate electrode sections GE2a of the select gate transistors SGSa. A second interlayer insulation film 20 is deposited on the top surfaces of the gate electrode sections GE1, the first interlayer insulation films 17 and the gate electrode sections GE2a, with a barrier insulation film (e.g., a SiN film) 19 interposed therebetween. The film 20 is also deposited between the gate electrode sections GE2a.

A source line contact SC is provided between the gate electrode sections GE2a of the select gate transistors SGSa. One end of the source line contact SC is connected to the diffusion layer 16 through the second interlayer insulation film 20, barrier insulation film 19 and gate insulation film 41. The other end thereof is connected to the common source line SL provided on the top surface of the second interlayer insulation film 20 in the row direction. The bit lines BL are provided on the common source line SL with a third interlayer insulation film 21 interposed therebetween, so as to extend in the direction (column direction) perpendicular to the common source line SL.

Though not shown, the select gate transistors SGDa connected to the bit lines BL via the bit line contacts BC have almost the same structure as that of the select gate transistors SGSa.

As described above, the trench 12 is formed in the surface area of the silicon substrate 11, and at least part of the gate electrode section GE2a of each of the select gate transistors SGDa and SGSa is formed in the trench 12. The select gate transistors SGDa and SGSa can thus be increased in gate length by the depth of the trench 12 and have channel components in the vertical direction to take measures against short-channel effects (SCE). Consequently, the select gate transistors SGDa and SGSa can be decreased in gate length in the horizontal direction by scaling without degrading cutoff characteristics, with the result that the NAND flash memory can be more decreased in area.

A method of manufacturing the above-described NAND flash memory (EEPROM) will be described with reference to FIGS. 16A to 16C through FIGS. 21A to 21C. In order to describe the method, the select gate transistors SGSa shown in FIG. 15 are taken as an example. Of these figures, FIGS. 16A, 17A, 18A, 19A, 20A and 21A are plan views, FIGS. 16B, 17B, 18B, 19B, 20B and 21B are sectional views taken along the bit lines (direction of gate length L of cells), and FIGS. 16C, 17C, 18C, 19C, 20C and 21C are sectional views taken along the word lines (direction of gate width W of cells).

Figure 16A:
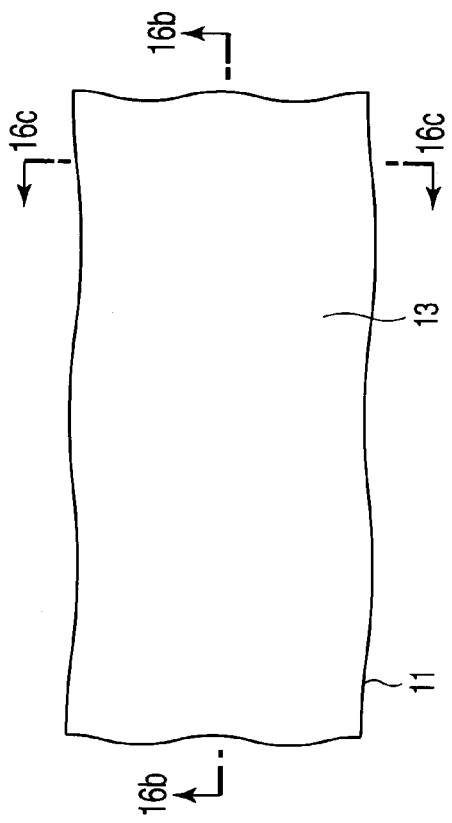
FIGS. 16A to 16C are illustrations of a method for manufacturing a nonvolatile semiconductor memory device, taking the cell array shown in FIG. 15 as an example.
Figure 16B:
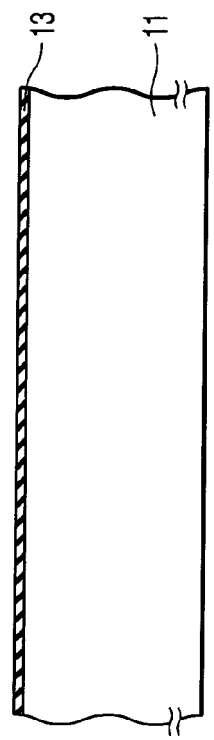
Figure 16C:
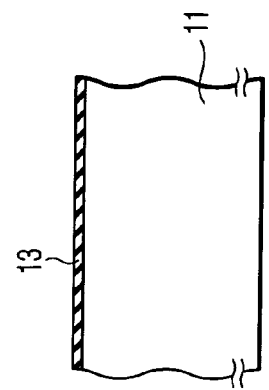

Referring first to FIGS. 16A to 16C, a gate insulation film 13 is formed on the entire top surface of the silicon substrate 11.

Figure 17A:
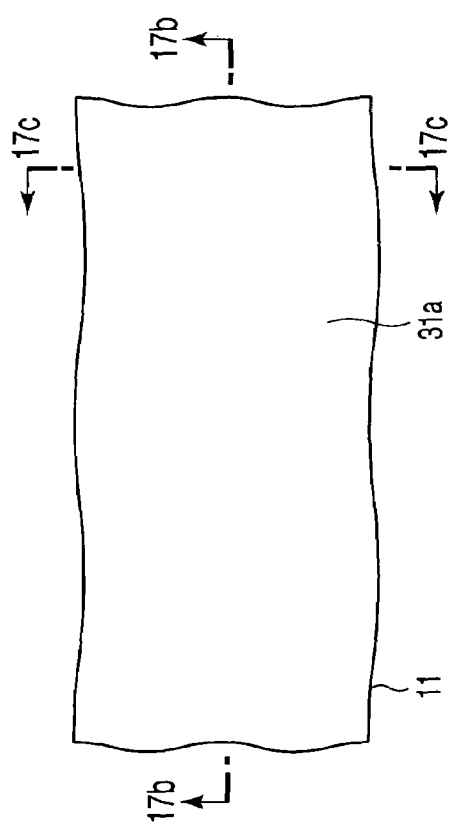
FIGS. 17A to 17C are illustrations of a method for manufacturing a nonvolatile semiconductor memory device, taking the cell array shown in FIG. 15 as an example.
Figure 17B:
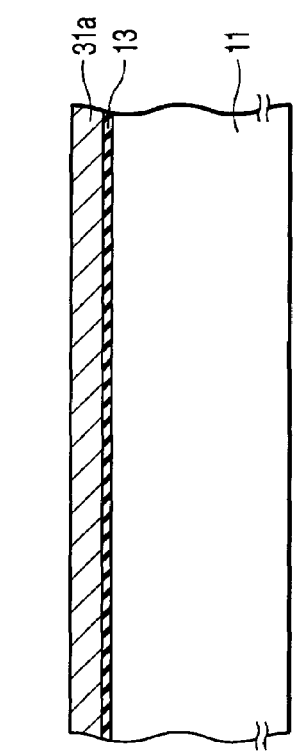
Figure 17C:
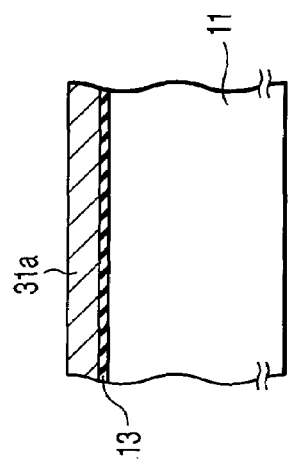

Referring then to FIGS. 17A to 17C, a conductive film 31a serving as a floating gate FG is deposited on the entire top surface of the gate insulation film 13.

Figure 18C:
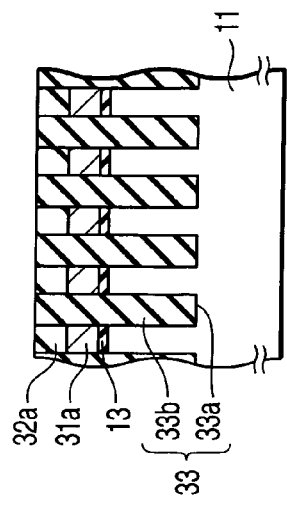
FIGS. 18A to 18C are illustrations of a method for manufacturing a nonvolatile semiconductor memory device, taking the cell array shown in FIG. 15 as an example.
Figure 18A:
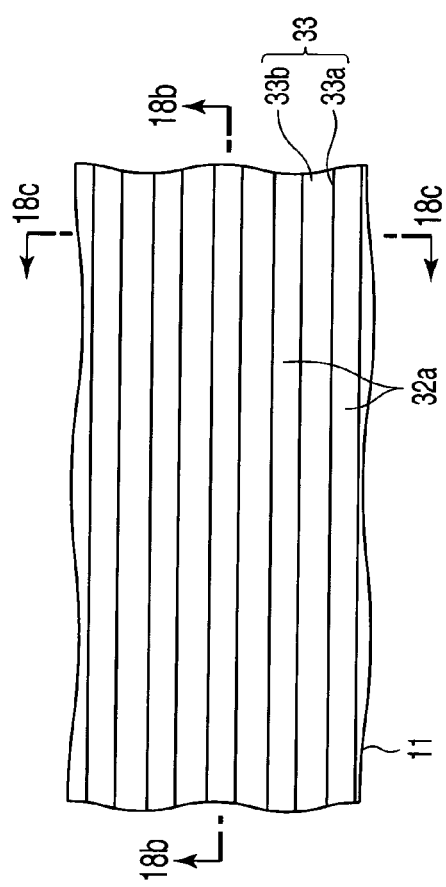
Figure 18B:
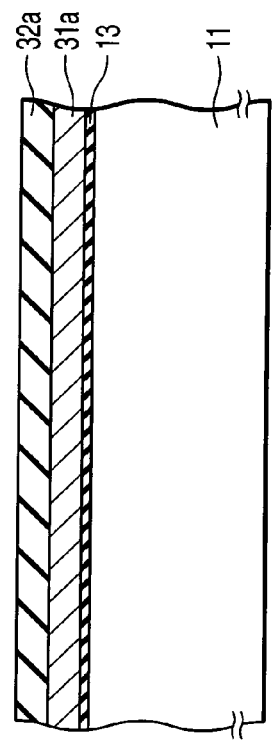

A SiN film serving as a mask member is deposited on the entire top surface of the conductive film 31a to have an almost uniform thickness. After that, as shown in FIGS. 18A to 18C, the SiN film is processed to form mask patterns 32a that are used for forming element isolation regions 33 having an STI structure. The mask patterns 32a are arranged in a striped fashion in the column direction along the bit lines. Using the mask patterns 32a, their underlying conductive film 31a, gate insulation film 13 and silicon substrate 11 are etched to form a plurality of trenches 33a. After that, the trenches 33a are filled with element isolating insulation films (e.g., oxide films) 33b and then the top surfaces of the films 33b are flattened by CMP or the like using the mask patterns 32a as stoppers, thereby completing the element isolation regions 33 having an STI structure.

Figure 19C:
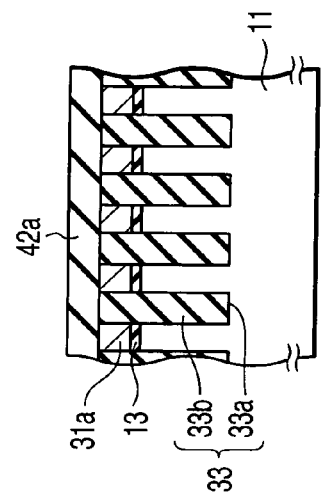
FIGS. 19A to 19C are illustrations of a method for manufacturing a nonvolatile semiconductor memory device, taking the cell array shown in FIG. 15 as an example.
Figure 19A:
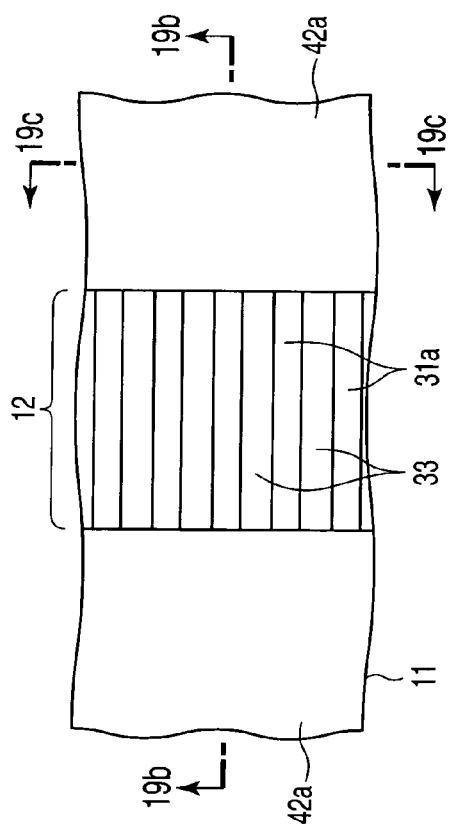
Figure 19B:
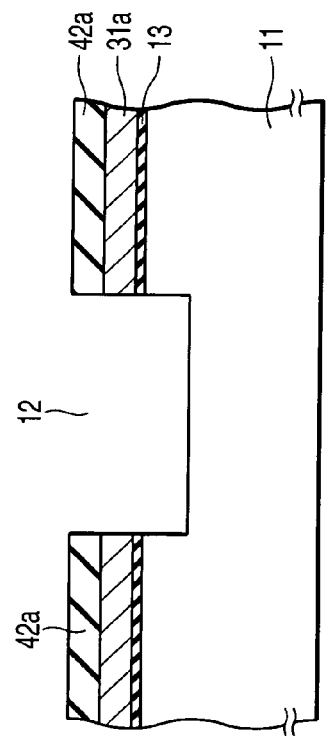

The mask patterns 32a are separated and then the top surfaces of the element isolation regions 33 are etched back to make the regions 33 flush with the top surface of the conductive film 31a. Subsequently, a SiN film serving as a mask member is deposited again on the entire top surfaces of the conductive film 31a and element isolation regions 33 to have an almost uniform thickness. After that, as shown in FIGS. 19A to 19C, the SiN film is processed to form a mask pattern 42a. Using the mask pattern 42a, its underlying conductive film 31a, gate insulation film 13, element isolation region 33 and silicon substrate 11 are etched to form a trench 12 to a given depth in conformity with a select gate transistor SGSa forming section.

Figure 20C:
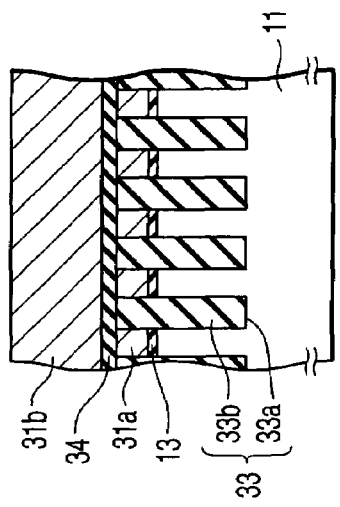
FIGS. 20A to 20C are illustrations of a method for manufacturing a nonvolatile semiconductor memory device, taking the cell array shown in FIG. 15 as an example.
Figure 20A:
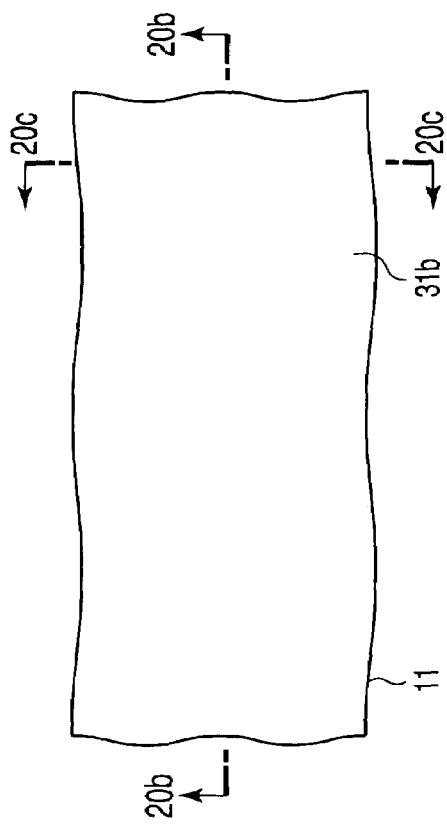
Figure 20B:
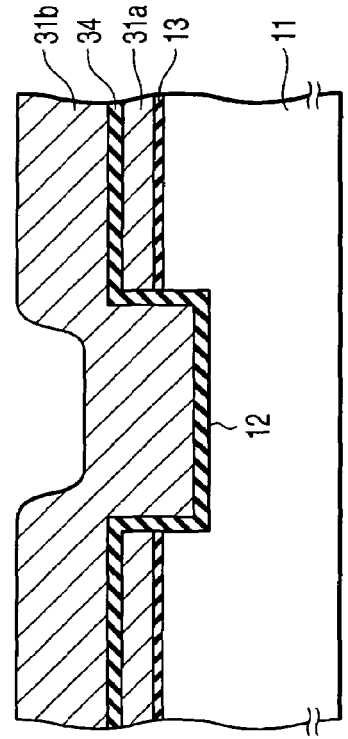

After the mask pattern 42a is separated, an insulation film 34 serving as the interpolysilicon insulation film 14 and a conductive film 31b serving as the control gate CG are deposited in sequence on the entire top surface of the resultant structure, as shown in FIGS. 20A to 20C.

Referring then to FIGS. 21A to 21C, the conductive layers 31b and 31a and the insulation film 34 are processed to form gate electrode sections GE1 of memory cell transistors MC on the surface of the silicon substrate 11 and, at the same time, gate electrode sections GE2a of select gate transistors SGSa on at least the opposed sidewalls of the trench 12. In the second embodiment, the gate electrode sections GE2a have channel components in the vertical direction and their gate length can be decreased in the horizontal direction more than conventional.

Subsequently, diffusion layers 15 each serving as a source or drain of the memory cell transistor MC are formed by ion implantation or the like in the surface area of the silicon substrate 11, with the gate insulation film 13 interposed therebetween, in conformity with both sides of each of the gate electrode sections GE1. At the same time, a diffusion layer 16 serving as a source of the select gate transistors SGSa is formed in the silicon substrate 11 and between the gate electrode sections GE2 in conformity with the trench 12. The drain of the select gate transistor SGSa and the diffusion layer 15 of the memory cell transistor MC adjacent thereto are common to each other. Thus, the memory cell transistors MC of each memory cell unit MCU are completed, as are the select gate transistors SGSa having channel components in the vertical direction.

After that, a first interlayer insulation film 17 is deposited on the entire surface of the resultant structure and buried into a gap between the gate electrode sections GE1 of the memory cell transistors MC. Then, the first interlayer insulation film 17 is etched back or the like to form a sidewall insulation film 18 on each of the sidewalls of the opposed gate electrode sections GE2 of the select gate transistors SGSa.

A barrier insulation film 19 and a second interlayer insulation film 20 are deposited on the entire surface of the resultant structure and then the top surface of the film 20 is flattened. A source line contact SC, which is connected to the diffusion layer 16, is formed between the gate electrode sections GE2a of the select gate transistors SGSa through the second interlayer insulation film 20, barrier insulation film 19 and gate insulation film 41. After a common source line SL, which is connected to the source line contact SC, is formed on the top surface of the second interlayer insulation film 20, a third interlayer insulation film 21 is formed on the entire surface of the resultant structure. Then, a bit line BL, which is connected to a select gate transistor SGDa (not shown), is formed on the top surface of the third interlayer insulation film 21. Thus, a memory cell array MCA having a section as shown in FIG. 15 is completed.

As described above, the select gate transistors SGDa are formed in almost the same step and having almost the same shape as the select gate transistors SGSa. The former transistors SGDa differ from the latter transistors SGSa in the following. The third interlayer insulation film 21 is formed without forming any source line contact SC after the top surface of the second interlayer insulation film 20 is flattened. The bit line contact BC, which is connected to the diffusion layer 16, is formed through the third interlayer insulation film 21, second interlayer insulation film 20, barrier insulation film 19 and gate insulation film 41. After that, a bit line BL that is connected to the bit line contact BC is formed on the top surface of the third interlayer insulation film 21.

In the foregoing second embodiment, too, the opposed sidewalls of the trench 12 are each almost perpendicular to the top surface of the silicon substrate 11. The present invention is not limited to this. The same advantages can be obtained if angle θ between each of the sidewalls and the top surface of the silicon substrate 11 is 20 degrees or more as shown in FIG. 13 or it is 160 degrees or less as shown in FIG. 14.

THIRD EMBODIMENT

Figure 22:
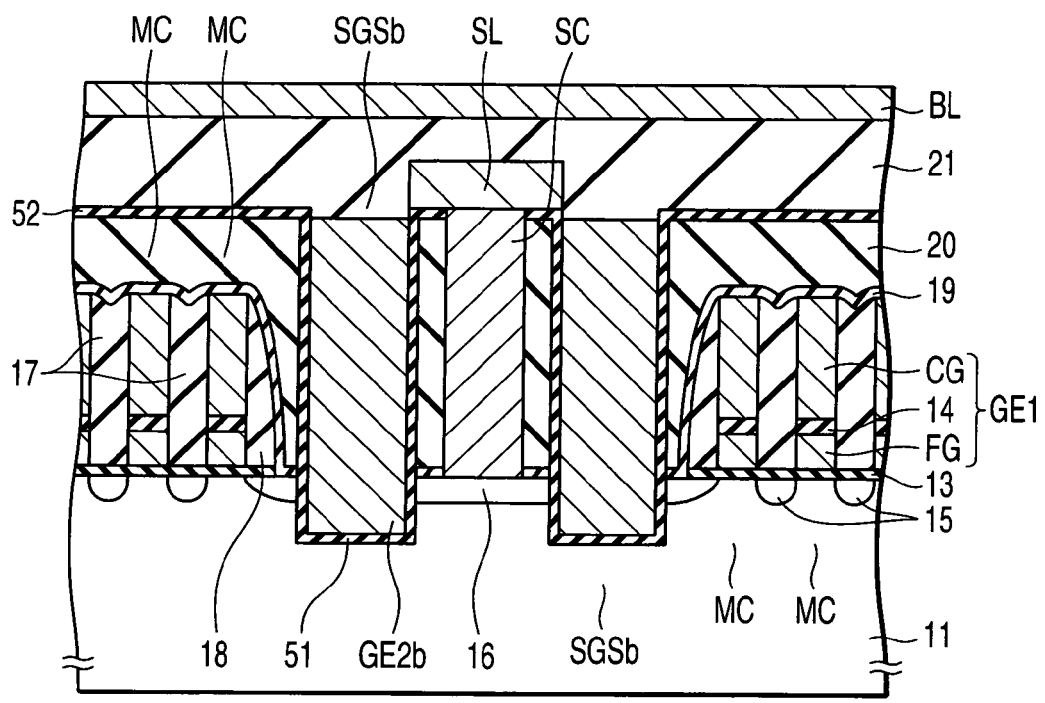
FIG. 22 is a sectional view showing a basic arrangement of the principal part of a nonvolatile semiconductor memory device (a sectional view of a cell array in a NAND flash memory) according to a third embodiment of the present invention.

FIG. 22 shows a basic arrangement of a nonvolatile semiconductor memory device (a section of a cell array) according to a third embodiment of the present invention. The nonvolatile semiconductor memory device will be described, taking a NAND flash memory (EEPROM) as an example, which includes NAND type memory cell units each having a given number of memory cell transistors arranged in series in a column direction. FIG. 22 is a sectional view taken along line III-III of FIG. 2. The same elements as those of FIG. 3 are denoted by the same reference numerals and their detailed descriptions are omitted.

Referring to FIG. 22, a plurality of memory cell transistors MC of each of memory cell units MCU are formed in the surface area of a silicon substrate 11. Each of the memory cell transistors MC includes a gate insulation film (e.g., a thin tunnel oxide film) 13, a floating gate FG, an interpolysilicon insulation film (e.g., ONO film or high-k film) 14, and a control gate CG. The floating gate FG, insulation film 14 and control gate CG serve as a gate electrode GE1. The control gates CG of the memory cell transistors MC are connected to each other to continue in the row direction as a word line WL. A diffusion layer 15, which serves as a source or a drain of each of the memory cell transistors MC, is formed in the surface area of the silicon substrate 11 in conformity with both sides of the gate electrode section GE1 in the column direction.

A select gate transistor SGSb is formed in a given position on the silicon substrate 11, e.g., at one end of a memory cell column MCL in each of the memory cell units MCU that are arranged in the row direction. The select gate transistor SGSb includes a gate electrode section GE2b whose structure is basically a trench gate structure. The gate electrode section GE2b is partly buried into the surface area of the silicon substrate 11. More specifically, the gate electrode section GE2b is formed of a polysilicon film, a metal film or the like and buried into a trench 51, which is formed in the surface area of the substrate 11 with a gate insulation film 52 interposed therebetween, through a second interlayer insulation film 20 and a barrier insulation film (e.g., SiN film) 19 which are provided on the top surface of the substrate 11.

The gate insulation film 52 is formed on the top surface of the second interlayer insulation film 20 and on the inner surface of the trench 51. The film 52 can be formed of a film, which differs in type or thickness from the gate insulation film 13 immediately below the gate electrode section GE1 of each memory cell transistor MC, by oxidation, deposition or the like. Furthermore, the interface between the bottom surface of the trench 51 and the silicon substrate 11 can be subjected to channel implantation for controlling a threshold value, when the need arises.

A diffusion layer 16 serving as a source common to the select gate transistors SGSb is formed in the surface area of the silicon substrate 11, with the barrier insulation film 19 interposed therebetween, in conformity with the select gate transistors SGSb. The drain of each of the select gate transistors SGSb and the source of the memory cell transistor MC adjacent thereto are common to each other.

In the third embodiment, at least part of the gate electrode section GE2b of each of the select gate transistors SGSb is buried into the surface area of the silicon substrate 11. Thus, the gate electrode section GE2b can be increased in length (gate length) in the vertical direction of the silicon substrate 11. In other words, even though the gate electrode section GE2b is decreased in gate length in the horizontal direction by scaling, the select gate transistors SGSb can have channel components in the vertical direction to take measures against short-channel effects (SCE). Consequently, as the device (NAND flash memory) reduces in area, the select gate transistors SGSb can adequately be decreased in gate length in the horizontal direction by scaling, which was impossible conventionally.

Moreover, the gate insulation film 52 of the gate electrode section GE2b of each of the select gate transistors SGSb can easily be caused to differ in type and thickness from the gate insulation film 13 immediately below the gate electrode section GE1 of each of the memory cell transistors MC. Even though the select gate transistors SGSb are decreased in gate length by scaling, the problems with the concentration of electric fields and the reliability of the gate insulation film 52 can be avoided.

A first interlayer insulation film 17 is buried between gate electrode sections GE1 of the memory cell transistors MC. A sidewall insulation film 18, which is made of the same material as that of the first interlayer insulation film 17, is formed on that sidewall of each of the gate electrode sections GE1 which is opposed to the gate electrode section GE2b. A second interlayer insulation film 20 is deposited on the top surfaces of the gate electrode sections GE1 of the memory cell transistors MC and the first interlayer insulation film 17, and the surface of the silicon substrate 11 which conforms to the diffusion layer 16, with a barrier insulation film 19 interposed therebetween, by a premetal dielectric (PMD) method.

A source line contact SC is provided between the gate electrode sections GE2b of the select gate transistors SGSb. One end of the source line contact SC is connected to the diffusion layer 16 through the second interlayer insulation film 20 and the barrier insulation film 19. The other end thereof is connected to a common source line SL, which is arranged in the row direction, through the second interlayer insulation film 20 and the gate insulation film 52. A bit line BL is provided on the common source line SL with a third interlayer insulation film 21 interposed therebetween, so as to extend in the direction (column direction) perpendicular to the common source line SL.

Though not shown, a select gate transistor SGDb connected to the bit line BL via the bit line contact BC has almost the same structure as that of the select gate transistor SGSb.

As described above, the gate electrode sections GE2b of the select gate transistors SGDb and SGSb are formed to have a trench gate structure in the surface area of the silicon substrate 11. The select gate transistors SGDb and SGSb can thus be increased in gate length by the depth of the trench 12 and have channel components in the vertical direction to take measures against short-channel effects (SCE). Consequently, the select gate transistors SGDb and SGSb can be decreased in gate length in the horizontal direction by scaling without degrading cutoff characteristics, with the result that the NAND flash memory can be more decreased in area.

A method of manufacturing the above-described NAND flash memory (EEPROM) will be described with reference to FIGS. 23A to 23C through FIGS. 27A to 27C. In order to describe the method, the select gate transistors SGSb shown in FIG. 22 is taken as an example. Of these figures, FIGS. 23A, 24A, 25A, 26A and 27A are plan views, FIGS. 23B, 24B, 25B, 26B and 27B are sectional views taken along the bit lines (direction of gate length L of cells), and FIGS. 23C, 24C, 25C, 26C and 27C are sectional views taken along the word lines (direction of gate width W of cells).

First, a gate insulation film 13 is formed on the entire top surface of the silicon substrate 11. Then, a conductive film, which serves as a floating gate FG, is deposited on the entire top surface of the gate insulation film 13. Then, the conductive film, the gate insulation film 13 and the silicon substrate 11 are processed to form a plurality of element isolation regions 33 having an STI structure arranged in the direction of bit lines BL and floating gates FG of gate electrode sections GE1 of memory cell transistors MC. The top surface of each of the element isolation regions 33 is etched back to adjust its level, and then an insulation film serving as an interpolysilicon insulation film 14 and a conductive film serving as a control gate CG are deposited on the entire top surfaces of the element isolation regions 33 and the floating gate FG. Then, the insulation film and the conductive film are processed to complete the gate electrode sections GE1 of the memory cell transistors MC. After that, a diffusion layer 15 is formed in the surface area of the silicon substrate 11, which conforms to both sides of each of the gate electrode sections GE1 in the column direction, by ion implantation or the like to serve as the source or drain of each of the memory cell transistors MC. At the same time, for example, a diffusion layer 16, which serves as the source or drain of each of the select gate transistors SGSb, is formed in the surface area of the silicon substrate 11, which conforms to the select gate transistors SGSb. The drain of each of the select gate transistors SGSb and the source of each of the memory cell transistors MC adjacent thereto are common to each other.

When the memory cell transistors MC are formed, a first interlayer insulation film 17 is deposited on the entire surface of the resultant structure to fill a gap between the gate electrode sections GE1 of the memory cell transistors MC. The first interlayer insulation film 17 is etched back to form a sidewall insulation film 18 on that sidewall of each of the gate electrode sections GE1 which is opposed to the gate electrode section GE2b. Then, a barrier insulation film 19 is deposited on the entire top surface of the silicon substrate 11 including the sidewall insulation film 18 (see FIGS. 23A to 23C).

Figure 24C:
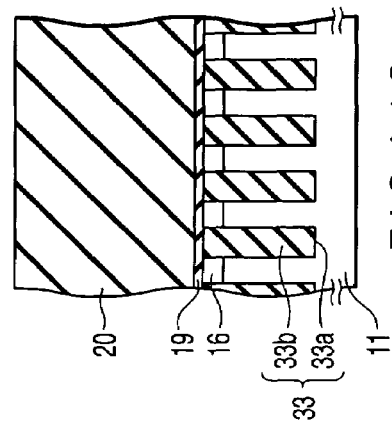
FIGS. 24A to 24C are illustrations of a method for manufacturing a nonvolatile semiconductor memory device, taking the cell array shown in FIG. 22 as an example.
Figure 24A:
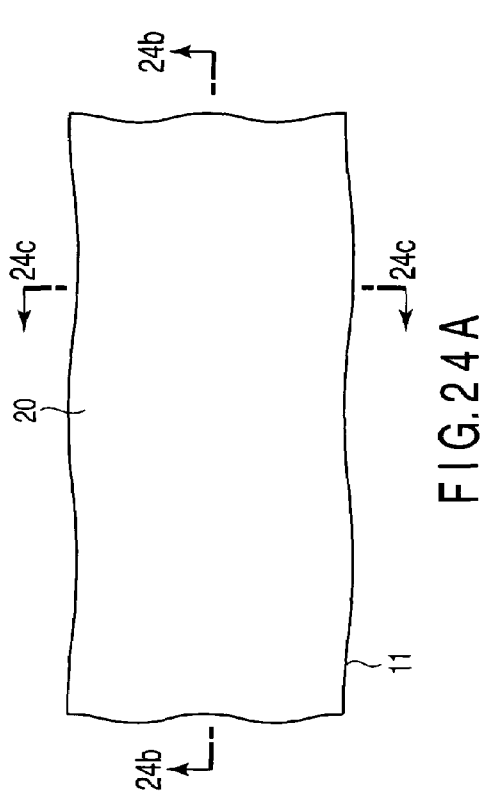
Figure 24B:
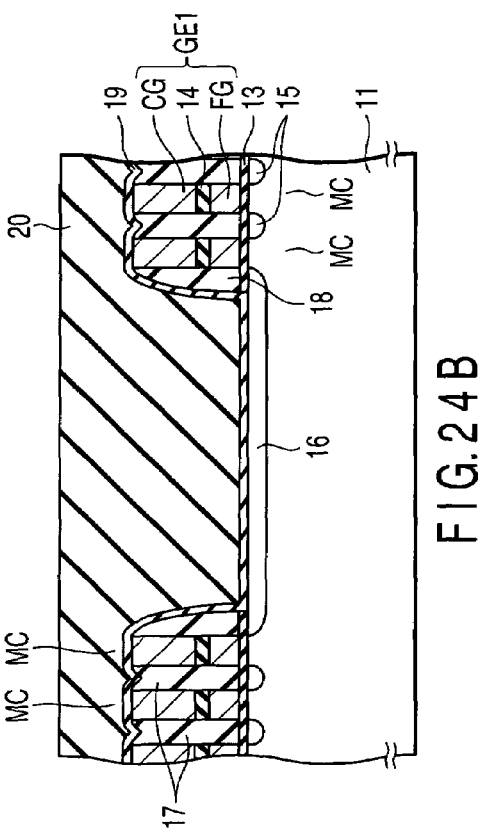

Referring then to FIGS. 24A to 24C, a second interlayer insulation film 20 is deposited on the entire top surface of the barrier insulation film 19 and the top surface of the film 20 is flattened by CMP or the like.

Referring then to FIGS. 25A to 25C, a trench 51 is formed to a given depth in conformity with a select gate transistor SGS forming position. The trench 51 is formed through the second interlayer insulation film 20 and the barrier insulation film 19 and deeper than the diffusion layer 16 so as to remove the surface area of the silicon substrate 11.

Referring then to FIGS. 26A to 26C, a gate insulation film 52 is formed by oxidation or deposition on the top surface of the second interlayer insulation film 20 including the inner surface of the trench 51.

Figure 27C:
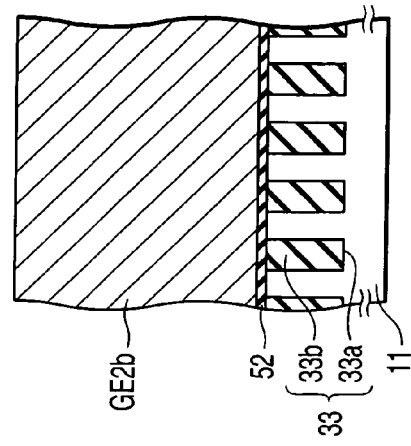
FIGS. 27A to 27C are illustrations of a method for manufacturing a nonvolatile semiconductor memory device, taking the cell array shown in FIG. 22 as an example.
Figure 27A:
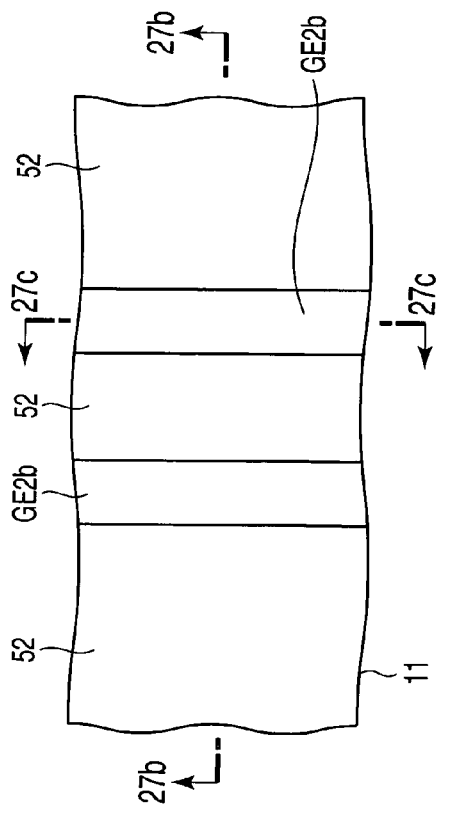
Figure 27B:
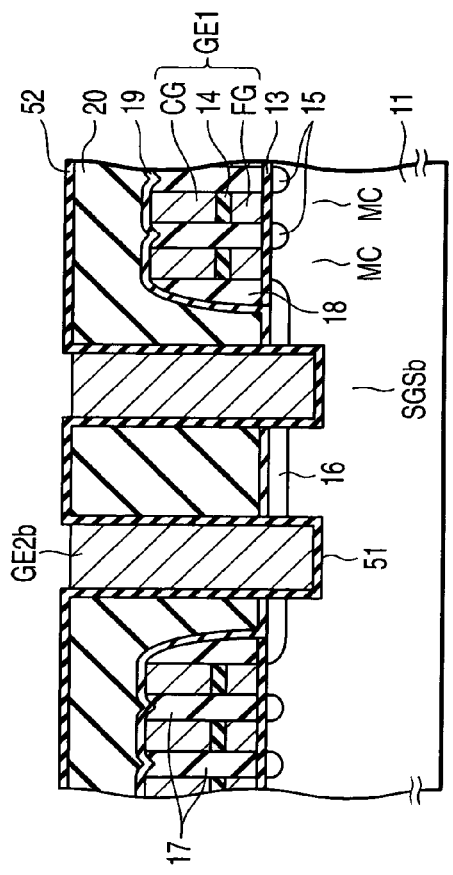

Referring then to FIGS. 27A to 27C, a polysilicon film or a metal film is buried in the trench 51 to form a gate electrode section GE2b of the select gate transistor SGSb. Thus, the select gate transistors SGSb can have channel components in the vertical direction.

In the third embodiment, the gate electrode sections GE2b of the select gate transistors SGSb have a trench gate structure in which at least part of each of the gate electrode sections GE2b is buried into the surface area of the silicon substrate 11. Since the gate electrode sections GE2b have channel components in the vertical direction, their gate length can be reduced in the horizontal direction more than conventional.

After that, a source line contact SC is formed between gate electrode sections GE2b of the select gate transistors SGSb and connected to the diffusion layer 16 through the gate insulation film 52, second interlayer insulation film 20 and barrier insulation film 19. Further, a common source line SL is formed on the top surface of the second interlayer insulation film 20 and connected to the source line contact SC through the gate insulation film 52, and then a third interlayer insulation film 21 is formed on the entire surface of the resultant structure. A bit line BL is formed on the top surface of the third interlayer insulation film to be connected to the select gate transistor SGDb (not shown). Thus, the memory cell array MCA having the section shown in FIG. 22 is completed.

As described above, the select gate transistors SGDb is formed in almost the same step and at almost the same time as the select gate transistors SGSb. The former transistors SGDb differ from the latter transistors SGSb in the following. The third interlayer insulation film 21 is formed without forming any source line contact SC after the gate electrode section GE2b is formed. The bit line contact BC is formed to be connected to the diffusion layer 16 through the third interlayer insulation film 21, gate insulation film 52, second interlayer insulation film 20, and barrier insulation film 19. After that, a bit line BL is formed on the top surface of the third interlayer insulation film 21 to be connected to the bit line contact BC.

In the foregoing third embodiment, the source line contact SC is formed in a step other than the step of forming the gate electrode sections GE2b of the select gate transistors SGSb. The present invention is not limited to this. For example, the source line contact SC can be formed by the same step as that of forming the gate electrode sections GE2b.

In the third embodiment, the source line contact SC can be formed to serve as a common source line SL without providing any common source line in particular.

Figure 28:
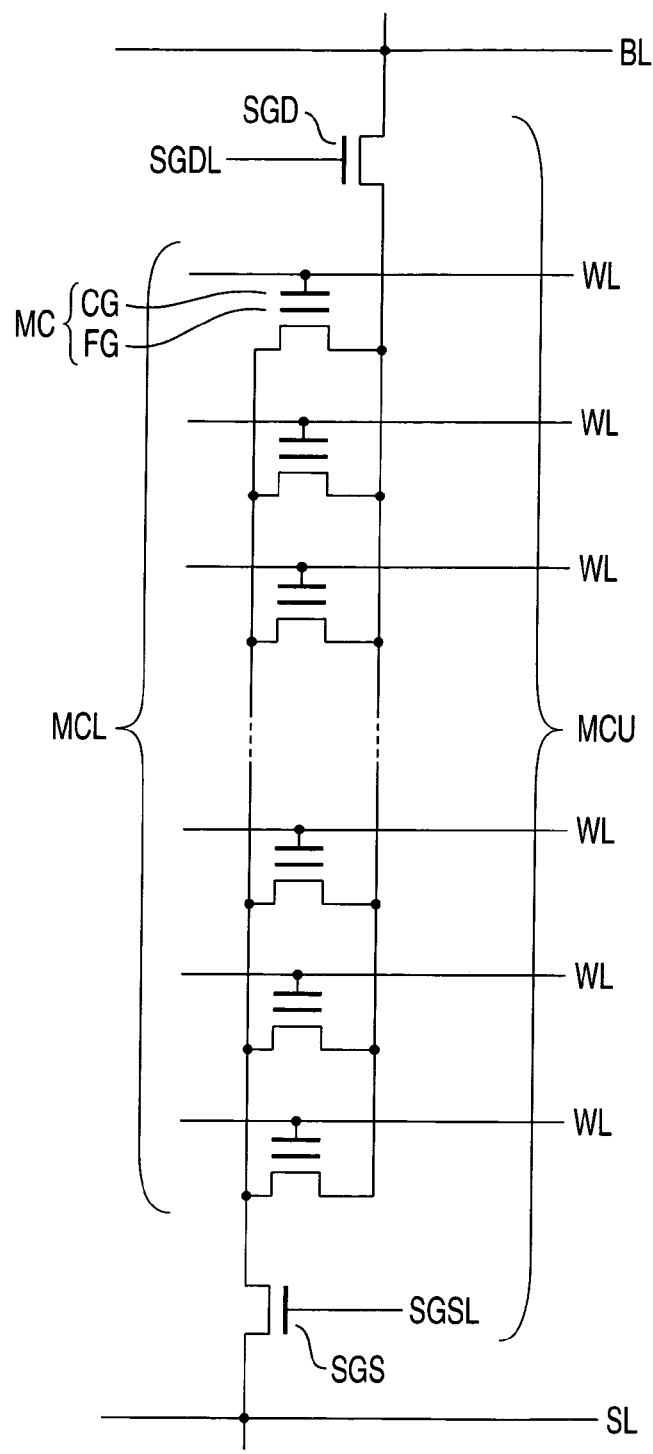
FIG. 28 is a circuit diagram showing a basic arrangement of a nonvolatile semiconductor memory device (an equivalent circuit of a cell array in a NAND flash memory) according to another embodiment of the present invention.

The above-described first to third embodiments are applied to a NAND flash memory. The present invention is not limited to this. For example, as shown in FIG. 28, the present invention can be applied to an AND flash memory including a memory cell unit MCU having an AND structure in which a given number of memory cell transistors MC are arranged in parallel in the row direction.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
    a substrate having a trench formed in a memory cell array region and along a direction parallel to a word line;
    a plurality of memory cell units formed in the memory cell array region and connected in a column direction which is perpendicular to the word line;
    a first select gate transistor formed in the memory cell array region and connected to one end of one of the memory cell units, the first select gate transistor having a gate electrode extending along the word line; and
    a second select gate transistor formed in the memory cell array region and connected to other end of said one memory cell unit, the second select gate transistor having a gate electrode extending along the word line,
    wherein at least part of the gate electrode of one of the first and second select gate transistors is provided in the trench.

2. The nonvolatile semiconductor memory device according to claim 1, wherein the gate electrode of one of the first and second select gate transistors is provided over a step portion between the trench and a surface of the substrate.

3. The nonvolatile semiconductor memory device according to claim 2, wherein an angle of the step portion between the trench and the surface of the substrate is not smaller than 20 degrees and not larger than 160 degrees.

4. The nonvolatile semiconductor memory device according to claim 2, wherein an angle of the step portion between the trench and the surface of the substrate is 90 degrees.

5. The nonvolatile semiconductor memory device according to claim 1, wherein said one of said memory cell units comprise plural memory cell transistors and one of the first and second select gate transistors has a gate insulation film which differs in thickness from a gate insulation film of each of the memory cell transistors.

6. The nonvolatile semiconductor memory device according to claim 1, wherein said one of said memory cell units comprise plural memory cell transistors and one of the first and second select gate transistors has a gate insulation film which differs in material from a gate insulation film of each of the memory cell transistors.

7. The nonvolatile semiconductor memory device according to claim 1, wherein said memory cell units comprise plural memory cell transistors and the memory cell units each have a NAND structure in which the memory cell transistors are arranged in series in the column direction.

8. The nonvolatile semiconductor memory device according to claim 1, wherein said memory cell units comprise plural memory cell transistors and the memory cell units each have an AND structure in which the memory cell transistors are arranged in parallel in the column direction.

9. The nonvolatile semiconductor memory device according to claim 1, wherein one of the first and second select gate transistors has a source region and a drain region which differ from each other in depth from a surface of the substrate.

10. The nonvolatile semiconductor memory device according to claim 1, wherein said one of said memory cell units comprise plural memory cell transistors and the gate electrode of one of the first and second select gate transistors is formed of material which is equal to that of a gate electrode of each of the memory cell transistors.

11. The nonvolatile semiconductor memory device according to claim 1, wherein said one of said memory cell units comprise plural memory cell transistors and the gate electrode of one of the first and second select gate transistors is formed simultaneously with a gate electrode of each of the memory cell transistors.

12. The nonvolatile semiconductor memory device according to claim 1, wherein said one of said memory cell units comprise plural memory cell transistors and the gate electrode of one of the first and second select gate transistors has a laminated structure which is equal to that of a gate electrode of each of the memory cell transistors.

13. The nonvolatile semiconductor memory device according to claim 12, wherein the gate electrode of one of the first and second select gate transistors is formed by stacking a first conductive film serving as a floating gate, a first insulation film serving as an interpolysilicon insulation film, a second conductive film serving as a control gate, which make up a gate electrode of each of the memory cell transistors.

14. The nonvolatile semiconductor memory device according to claim 13, wherein the first conductive film and the second conductive film are electrically connected to each other.

* * * * *